United States Patent [19]
Kimmich et al.

[11] Patent Number: 5,345,174
[45] Date of Patent: Sep. 6, 1994

[54] SLICE-SELECTIVE POLARIZATION TRANSFER FOR LOCALIZED SOLID-STATE NMR SPECTROSCOPY

[75] Inventors: Rainer Kimmich, Ulm, Fed. Rep. of Germany; Dan Demco, Cluy-Napoca, Romania; Siegfried Hafner, St. Ingbert-Rohrbach, Fed. Rep. of Germany

[73] Assignee: Bruker Analytische Messtechnik, Fed. Rep. of Germany

[21] Appl. No.: 944,847

[22] Filed: Sep. 14, 1992

[30] Foreign Application Priority Data

Sep. 14, 1991 [DE] Fed. Rep. of Germany ....... 4130662

[51] Int. Cl.$^5$ .............................................. G01V 3/00
[52] U.S. Cl. .............................................. 324/309
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,345,207 | 8/1982 | Bertrand | 324/308 |
| 4,677,382 | 6/1987 | Vatis | 324/307 |
| 4,701,708 | 10/1987 | Hardy | 324/311 |
| 4,769,602 | 9/1988 | Vinegar et al. | 324/303 |
| 4,922,203 | 5/1990 | Laurel | 324/307 |
| 5,064,638 | 11/1991 | Moore et al. | 324/307 |
| 5,099,206 | 3/1992 | Imaizumi | 324/307 |
| 5,170,120 | 12/1992 | Barbara et al. | 324/307 |

FOREIGN PATENT DOCUMENTS

0347990 6/1989 European Pat. Off. .

OTHER PUBLICATIONS

Journal of Magnetic Resonance, vol. 93, No. 2, Jun. 15, 1991, Orlando, Minn., U.S., pp. 299–318.
N. Beckmann et al., "Analysis of Localized Polarization Transfer for $^{13}C$ Volume–Selective Spectroscopy with Surface Coils".
Magnetic Resonance in Medicine, vol. 15, No. 1, Jul. 1, 1990, Duluth, Minn., U.S., pp. 102–111 and 158–164.
S. D. Swanson et al., "Proton–Enhanced $^{13}C$ Imaging/Spectroscopy by Polarization Transfer".
Y. Ueshima et al., "In Vivo $^{13}C$ Imaging Enhanced by Polarization Transfer".
Journal of Magnetic Resonance, vol. 79, No. 3, Oct. 1, 1988, Orlando, Minn., U.S., pp. 391–403.
L. K. Hedges et al., "The Techniques of Rotating Frame Selective Excitation and Some Experimental Results".

*Primary Examiner*—Michael J. Tokar
*Attorney, Agent, or Firm*—Cesari and McKenna

[57] ABSTRACT

A new method of spatial localization in solids using the high off-resonance sensitivity of heteronuclear polarization transfer is presented in theory and experiment. Application in imaging and volume-selective spectroscopy are discussed and test experiments to this end are reported.

5 Claims, 29 Drawing Sheets

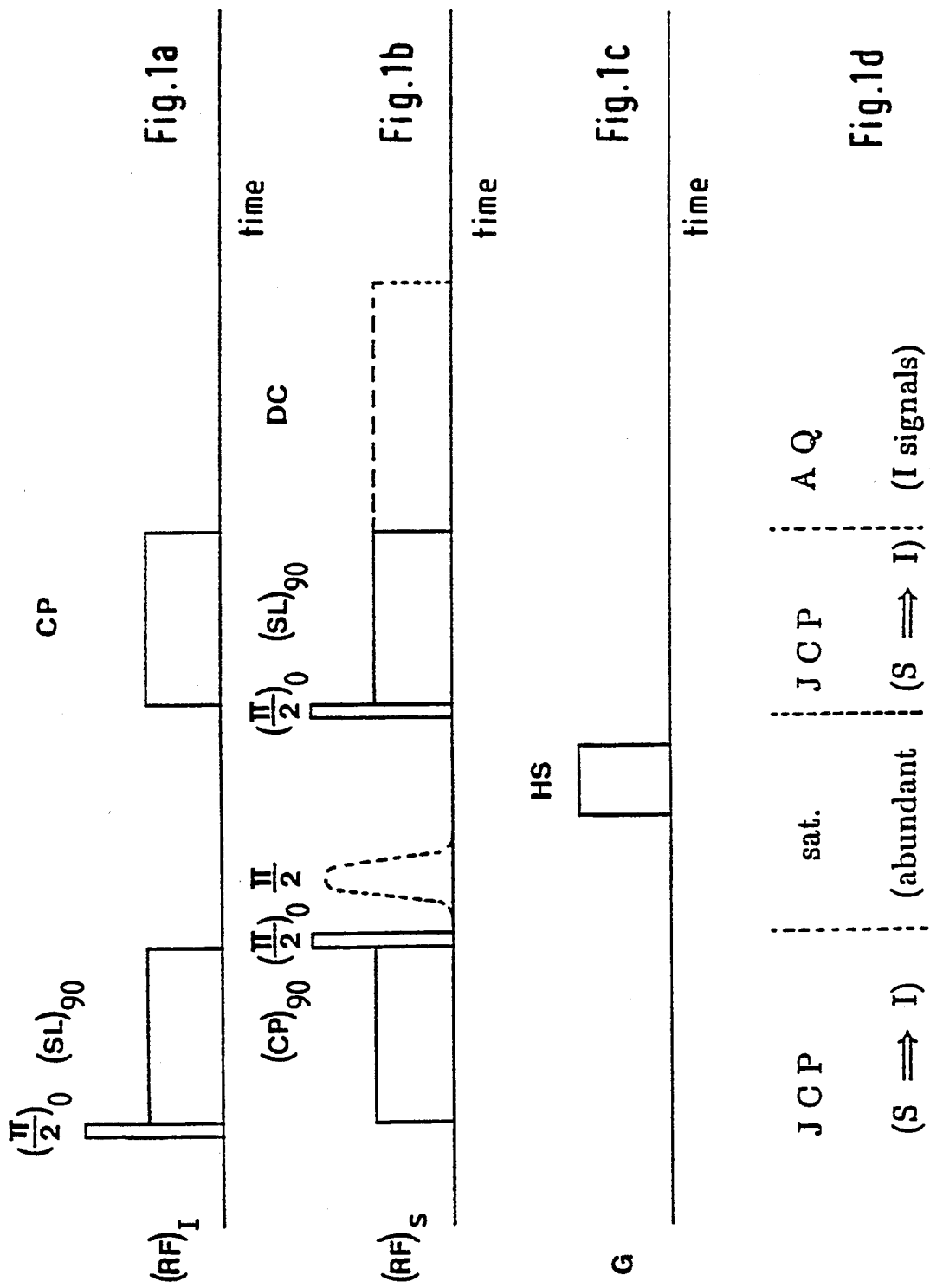

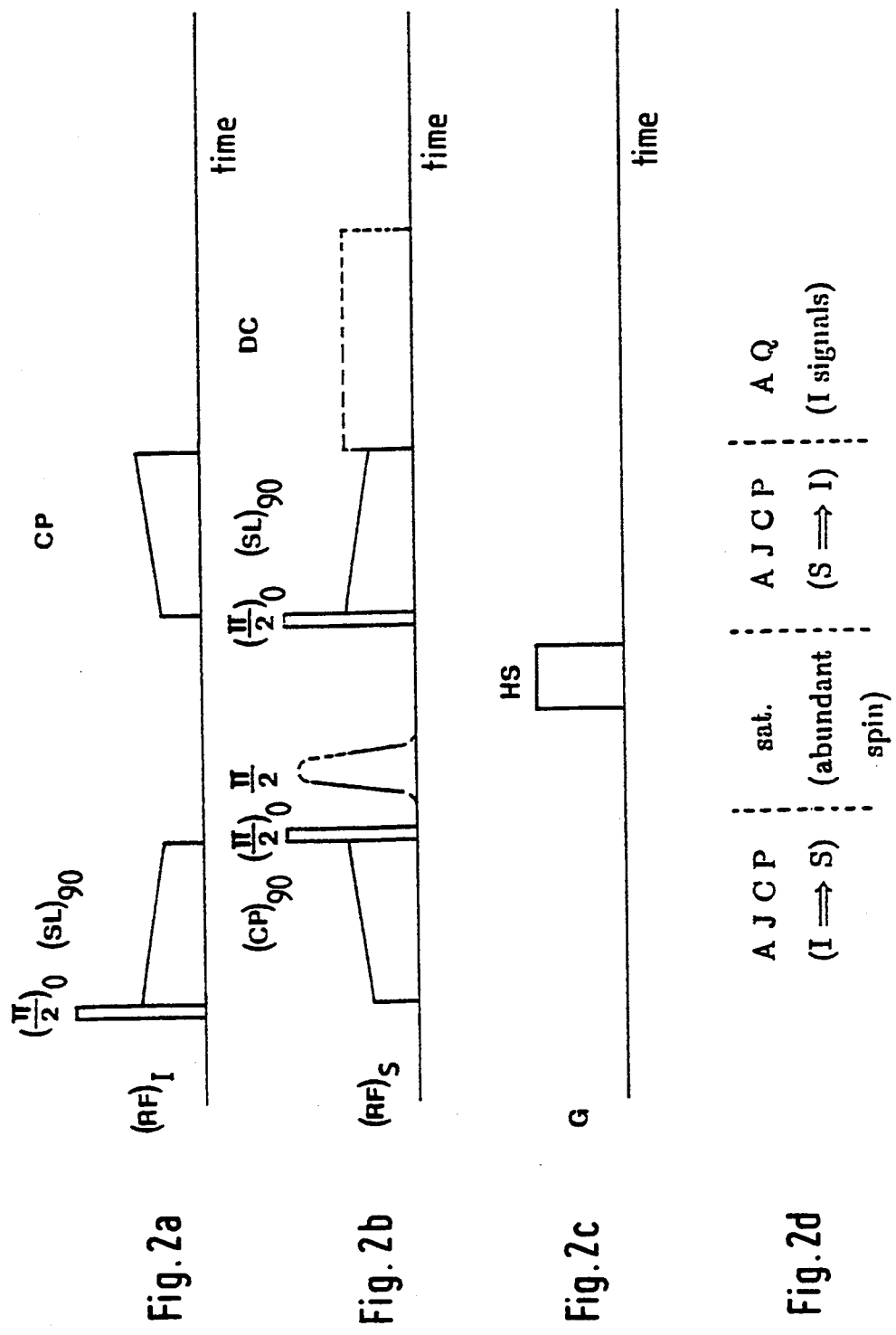

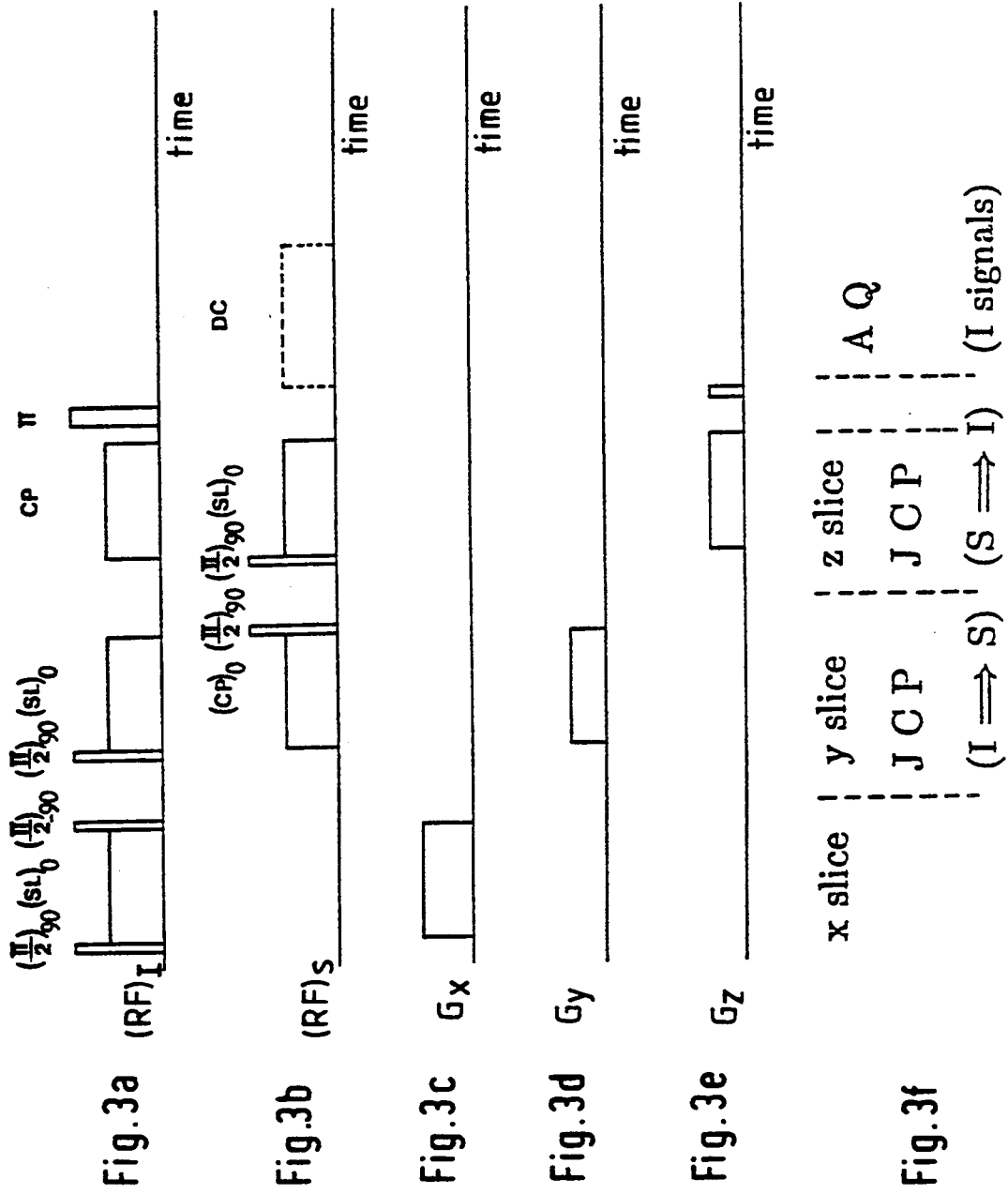

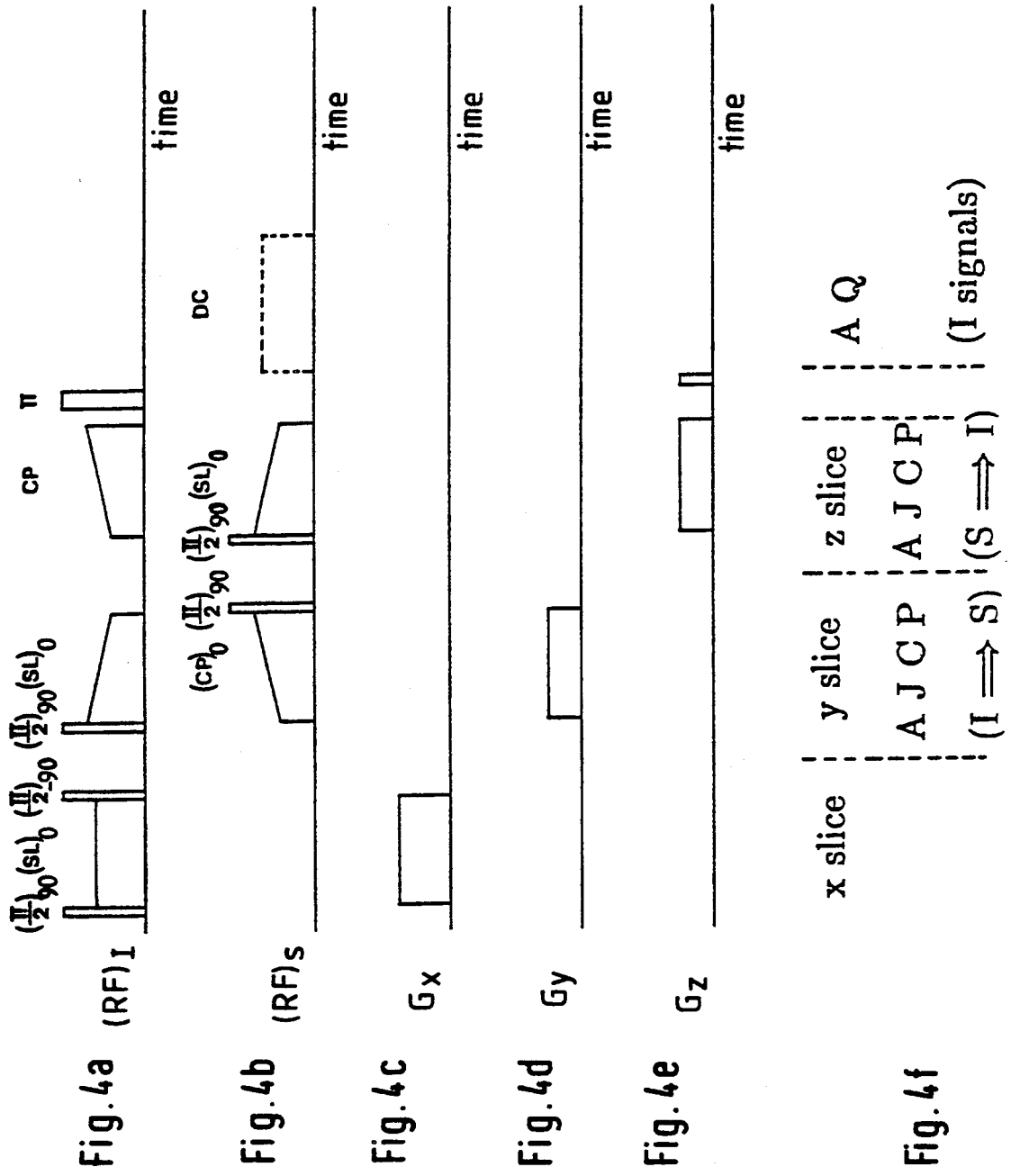

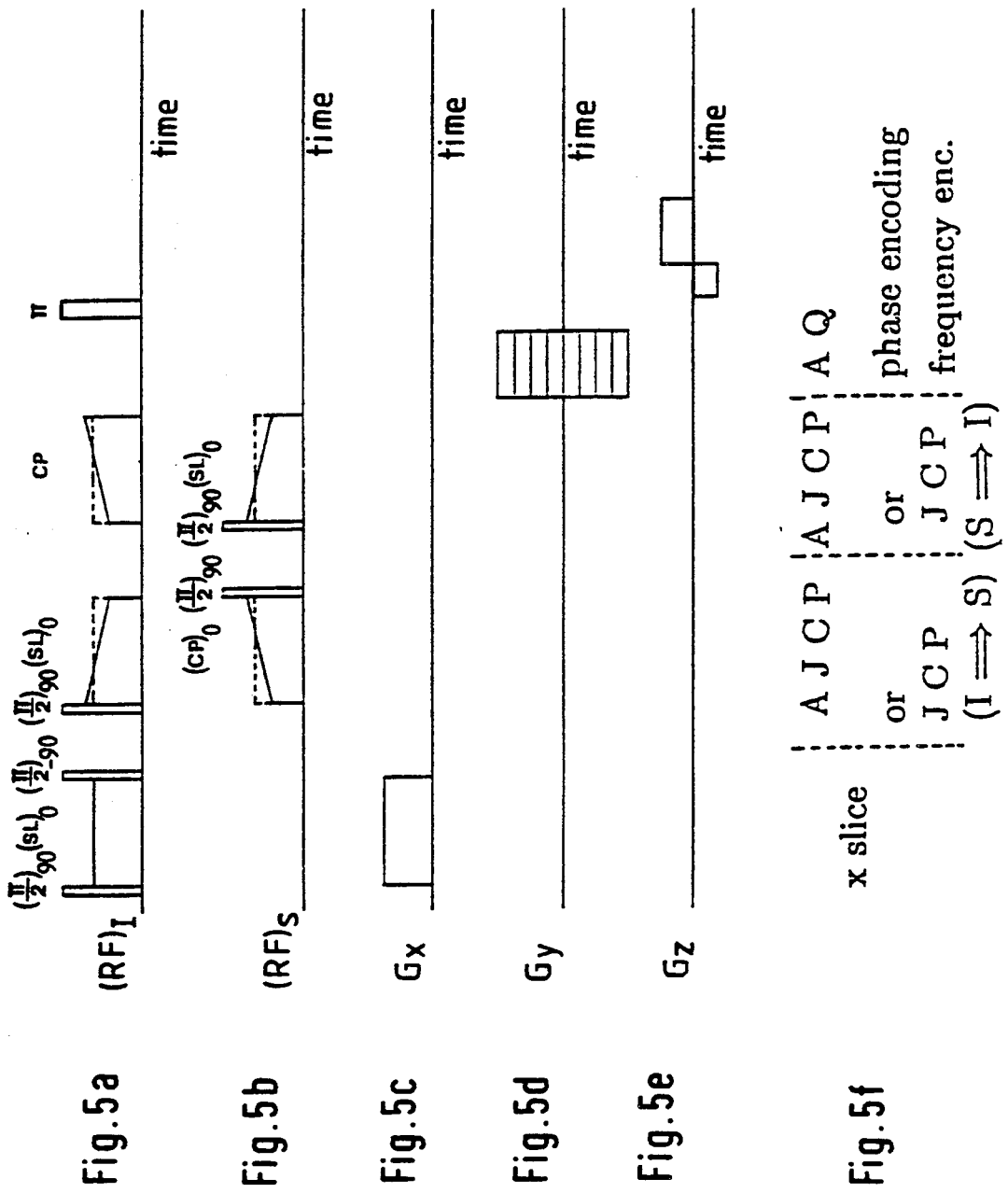

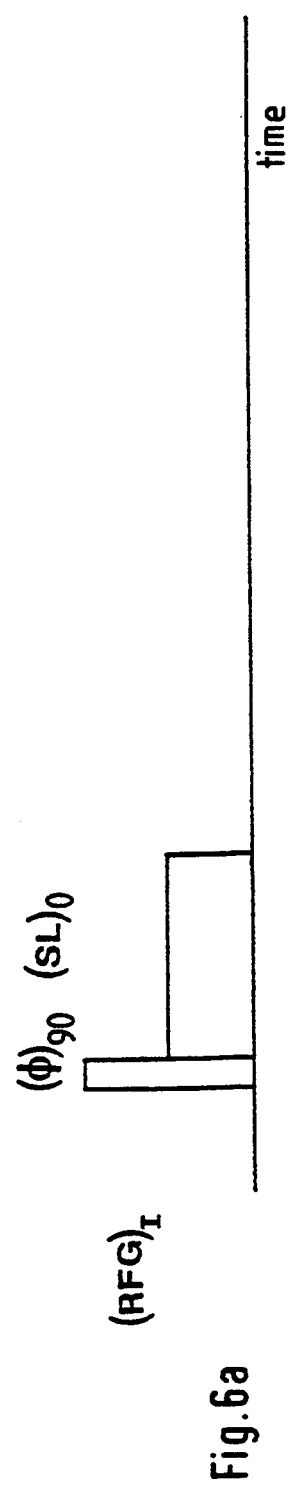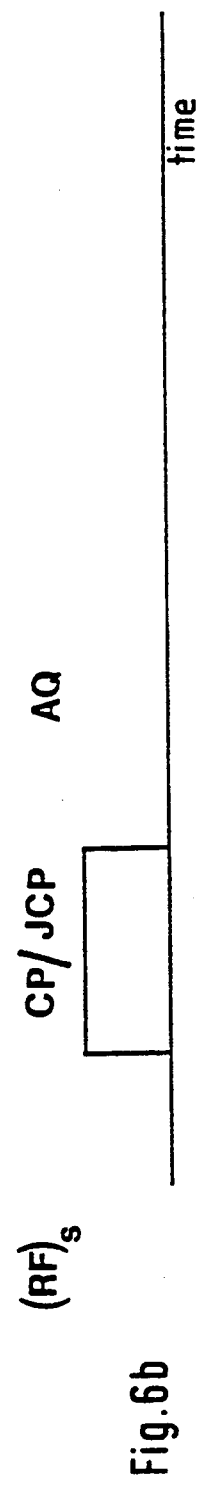

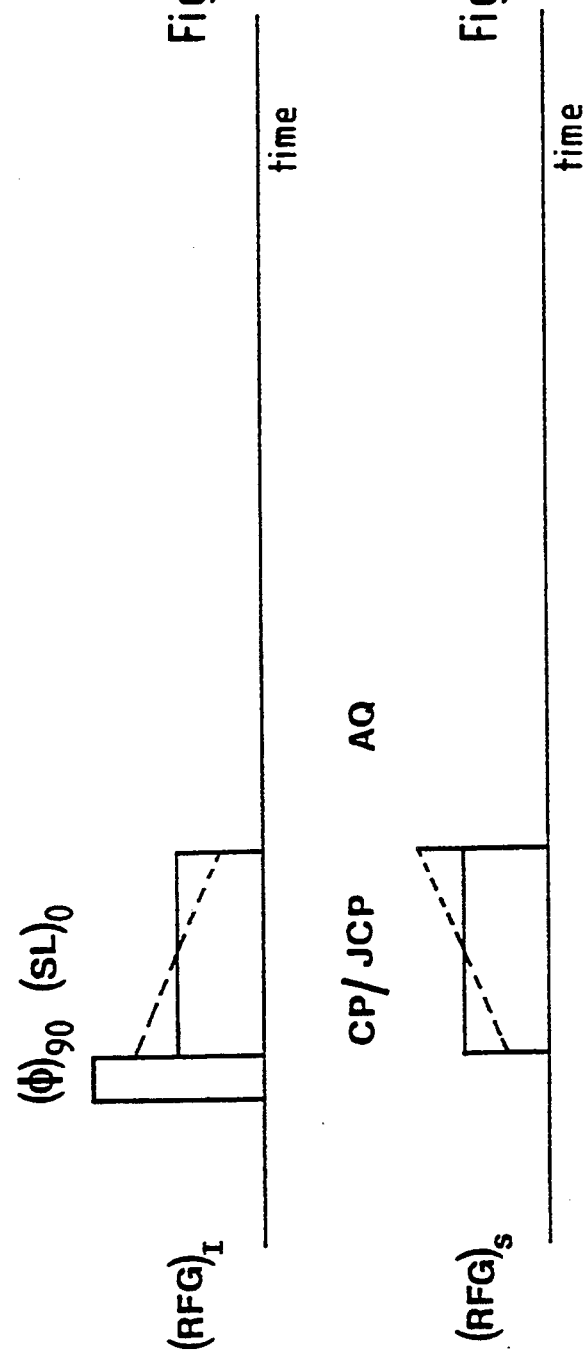

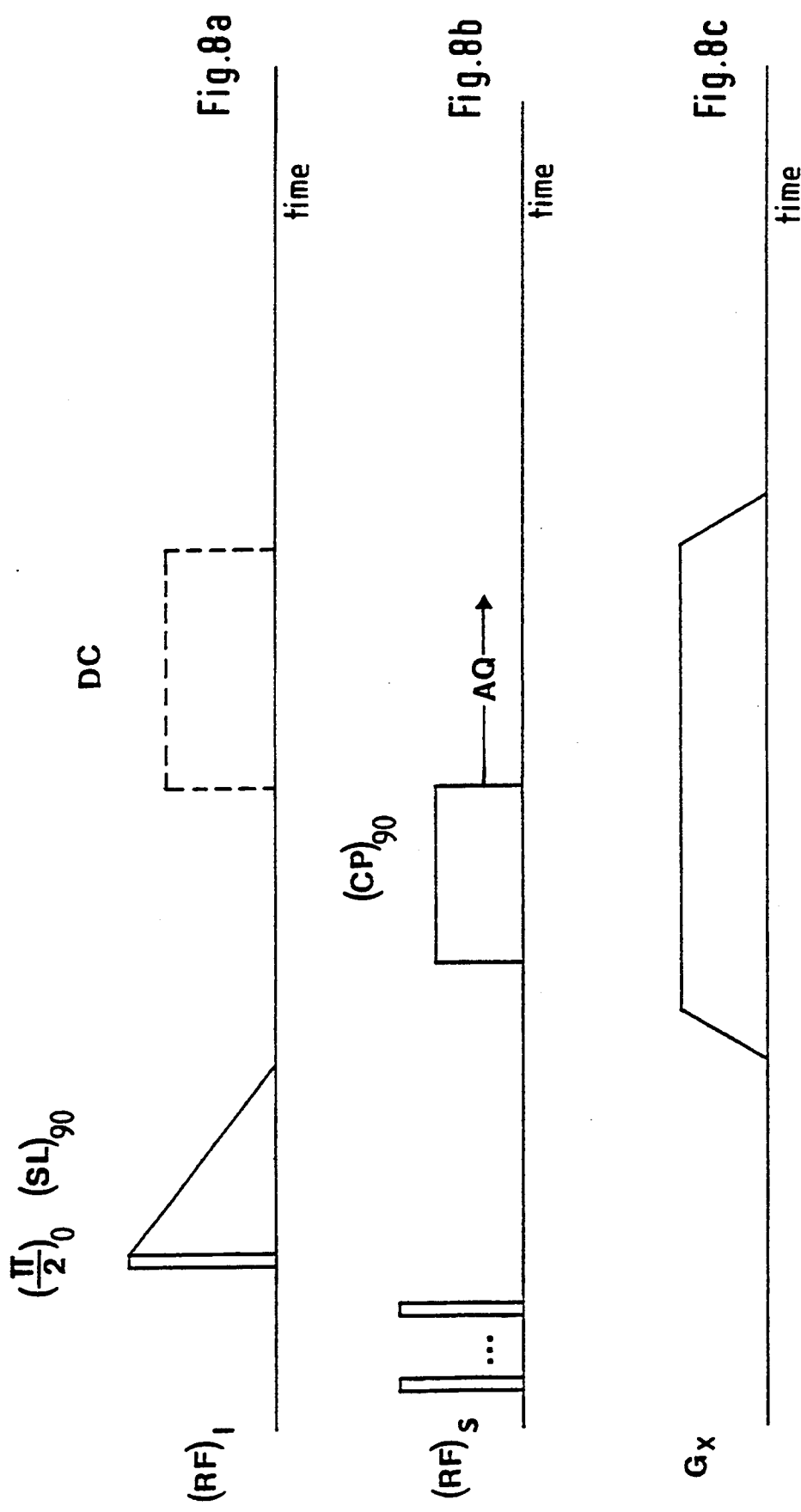

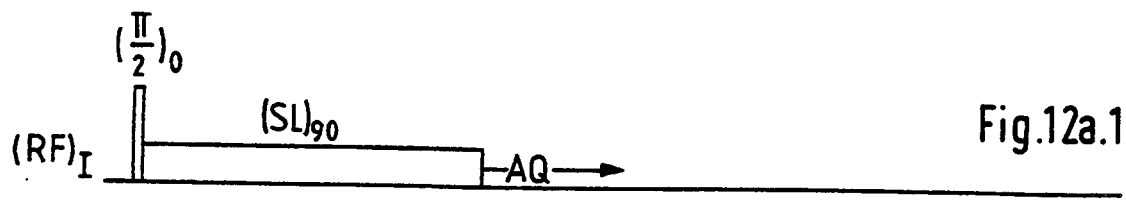
Fig.12a.1
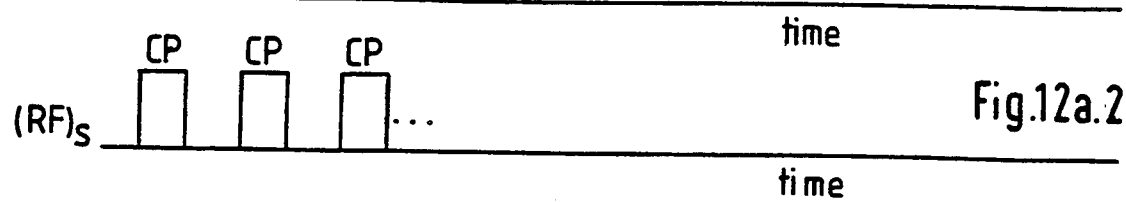
Fig.12a.2
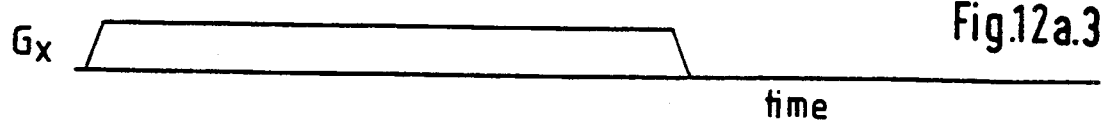
Fig.12a.3
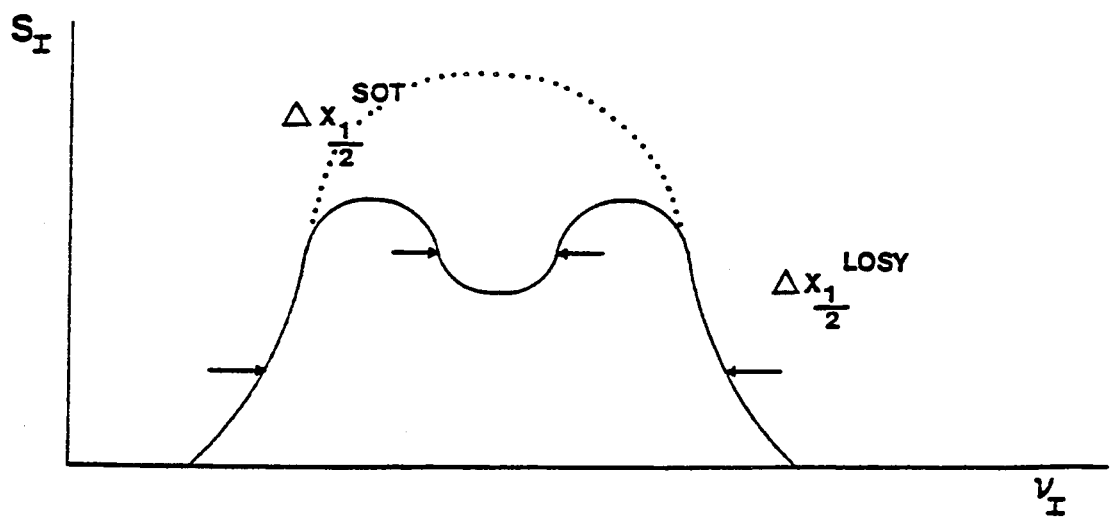
Fig.12b

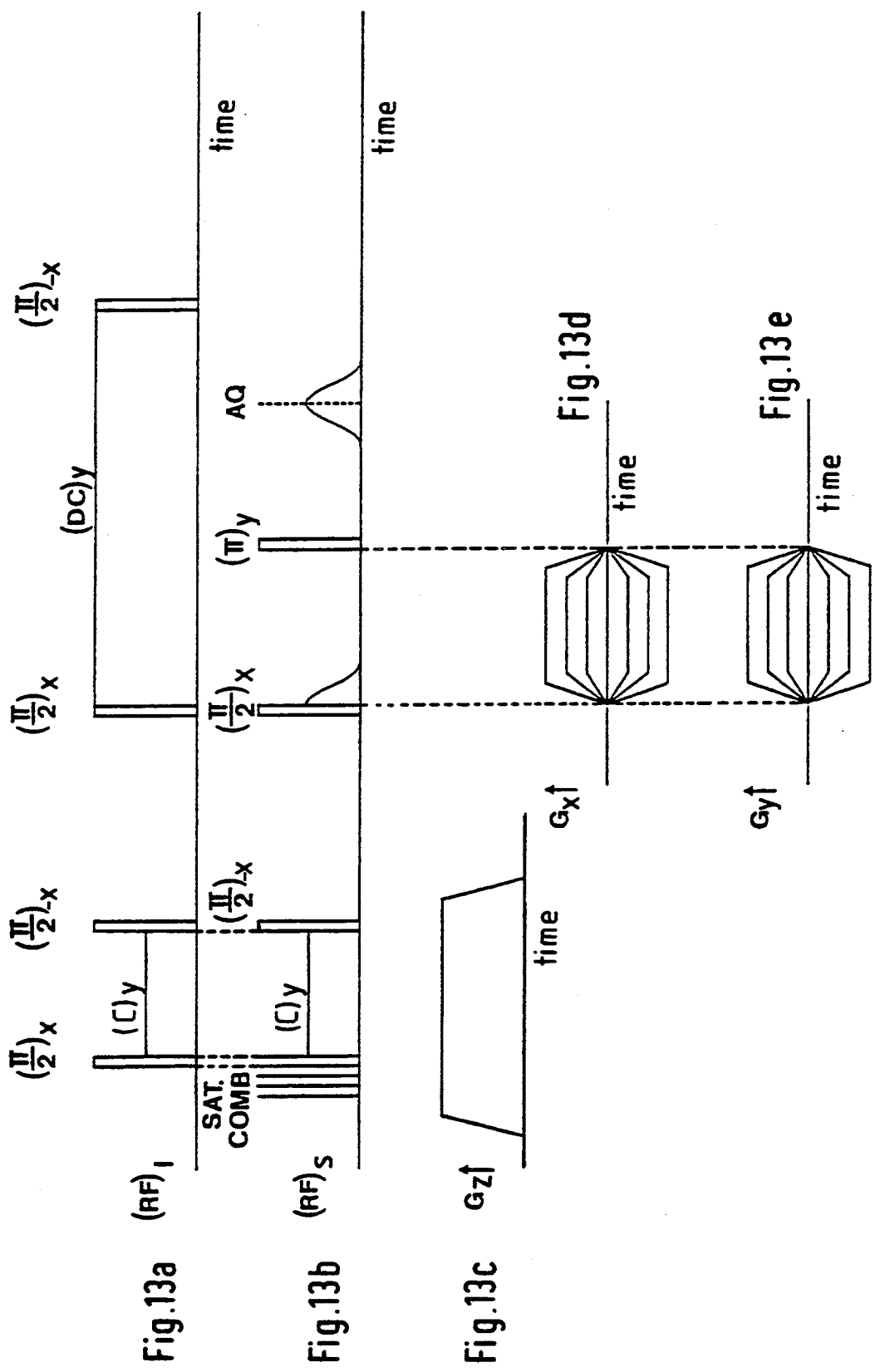

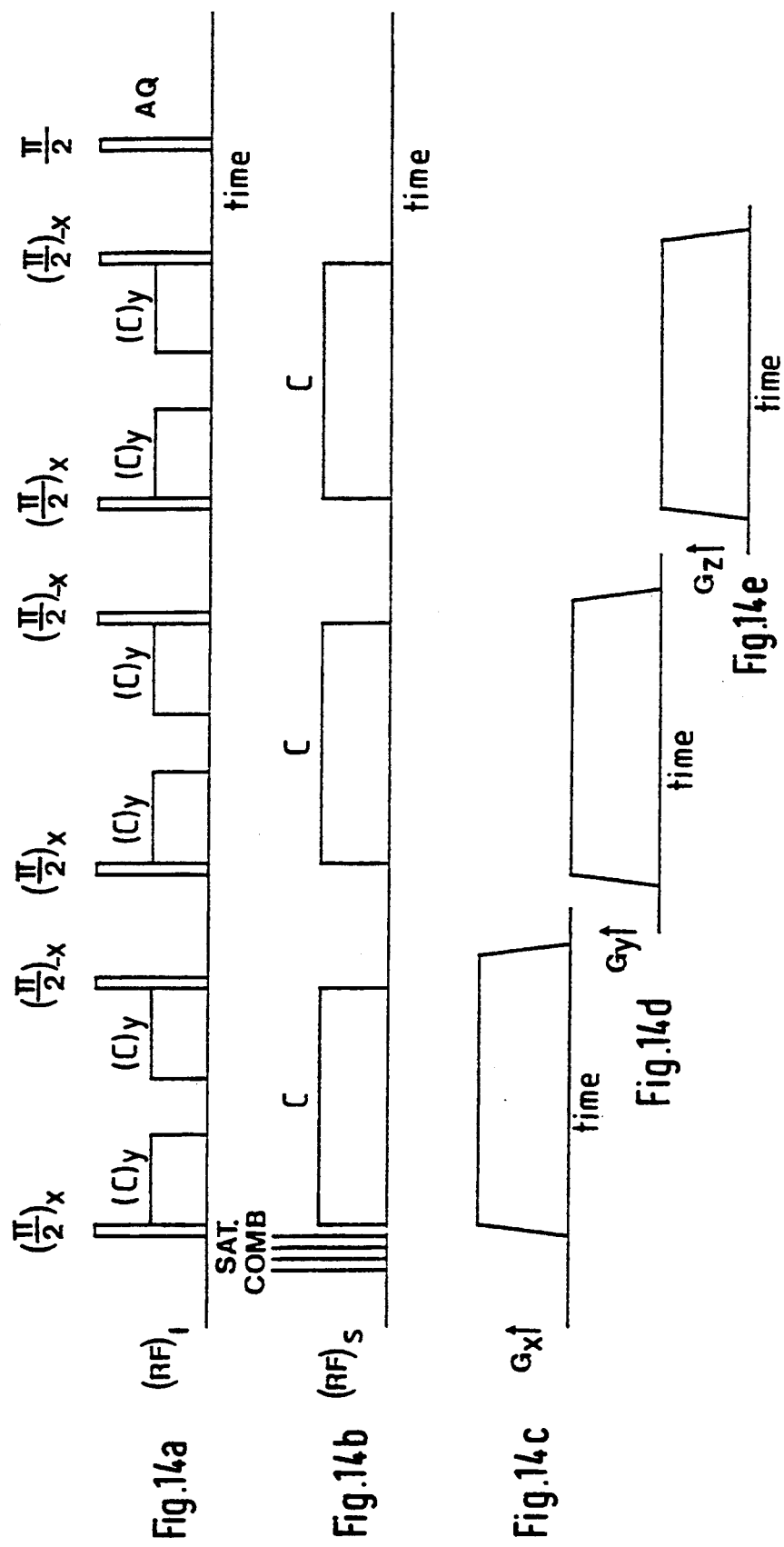

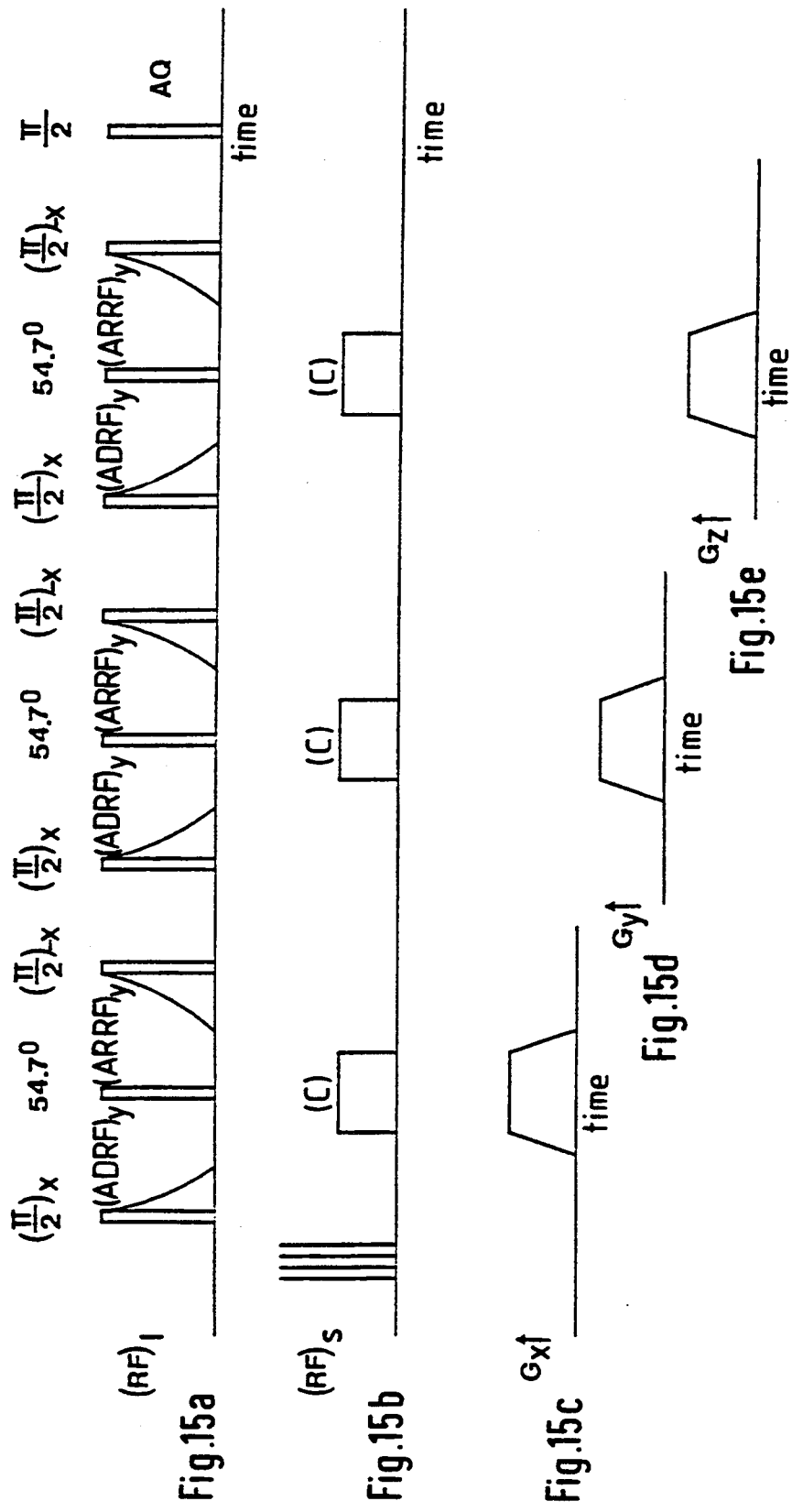

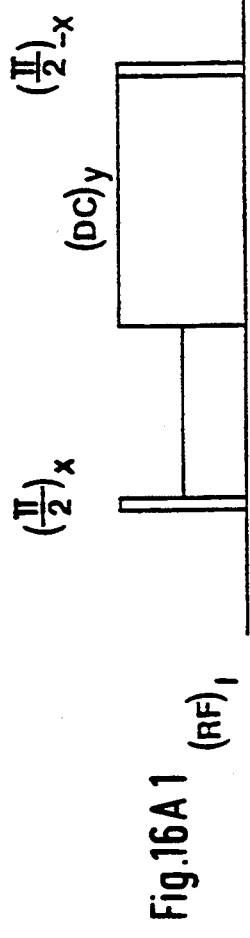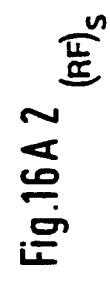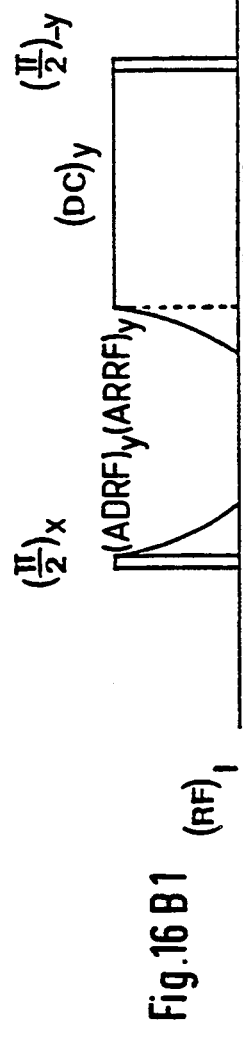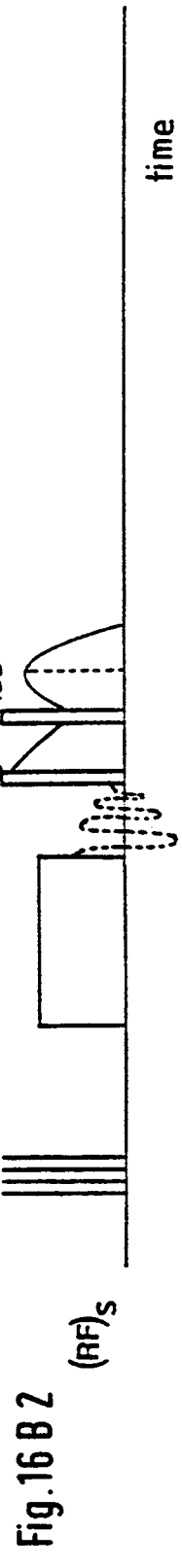

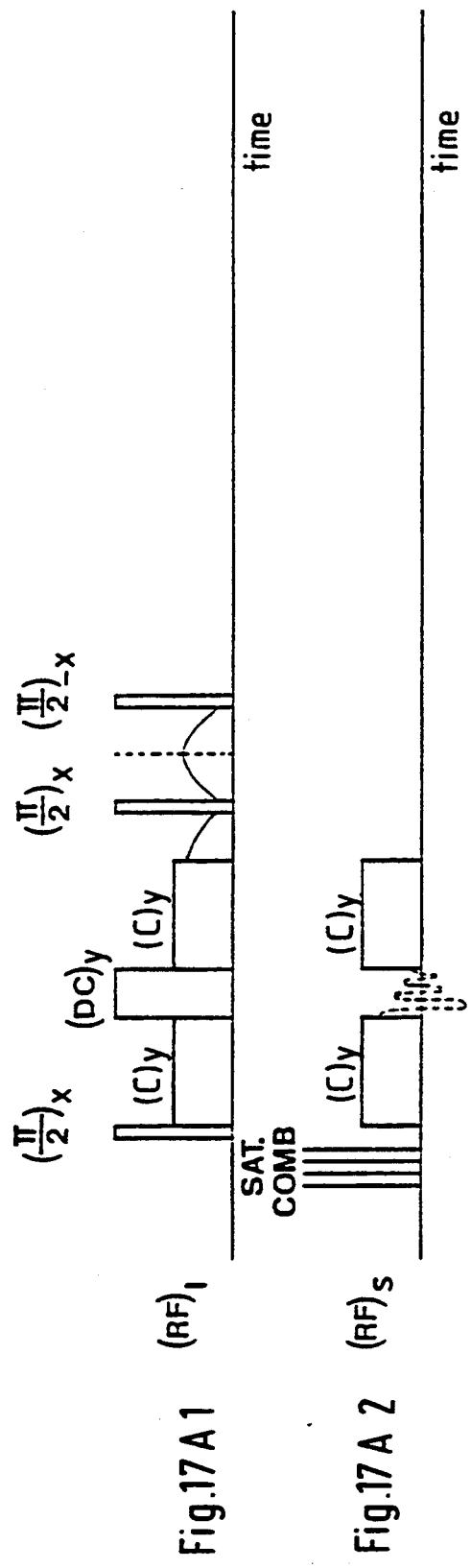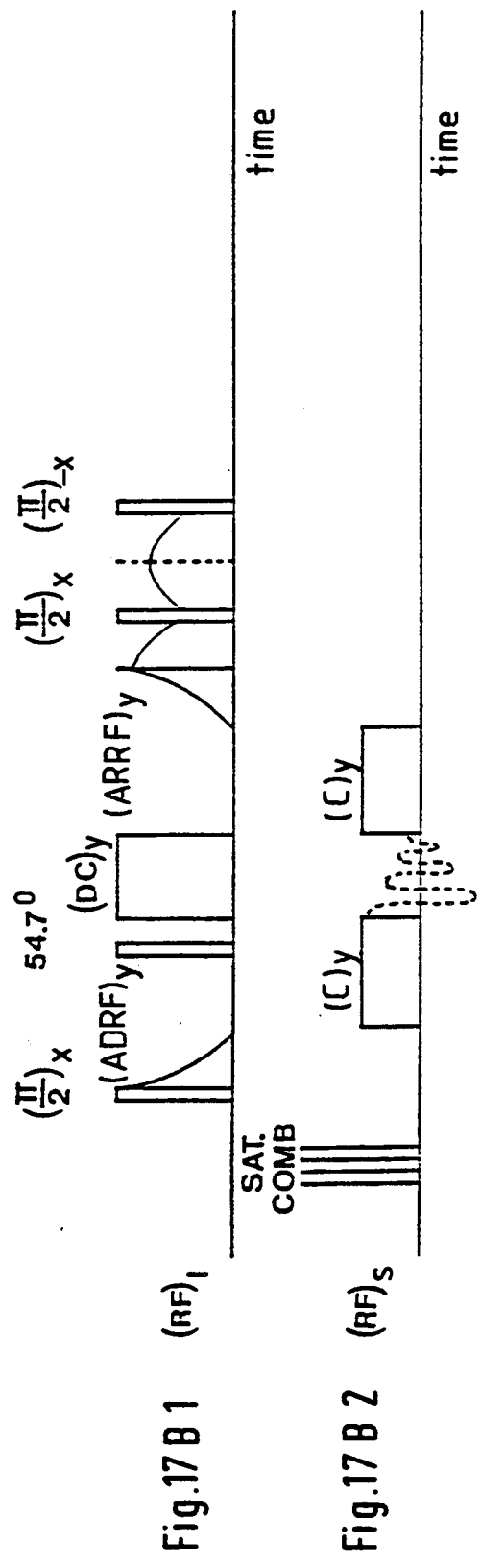

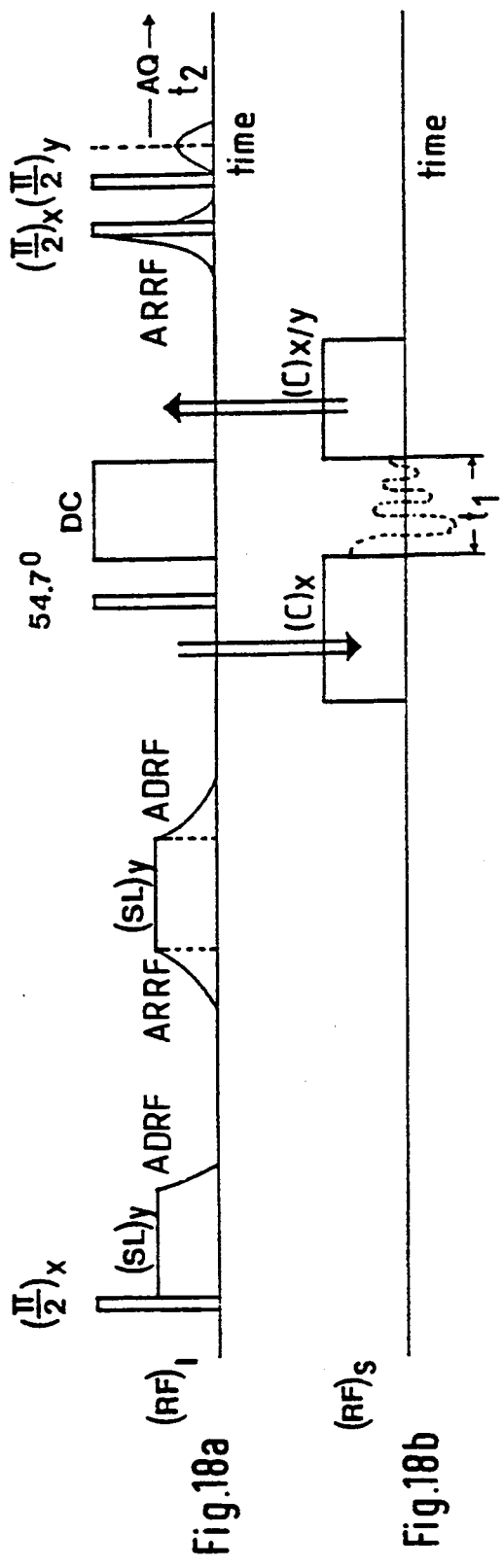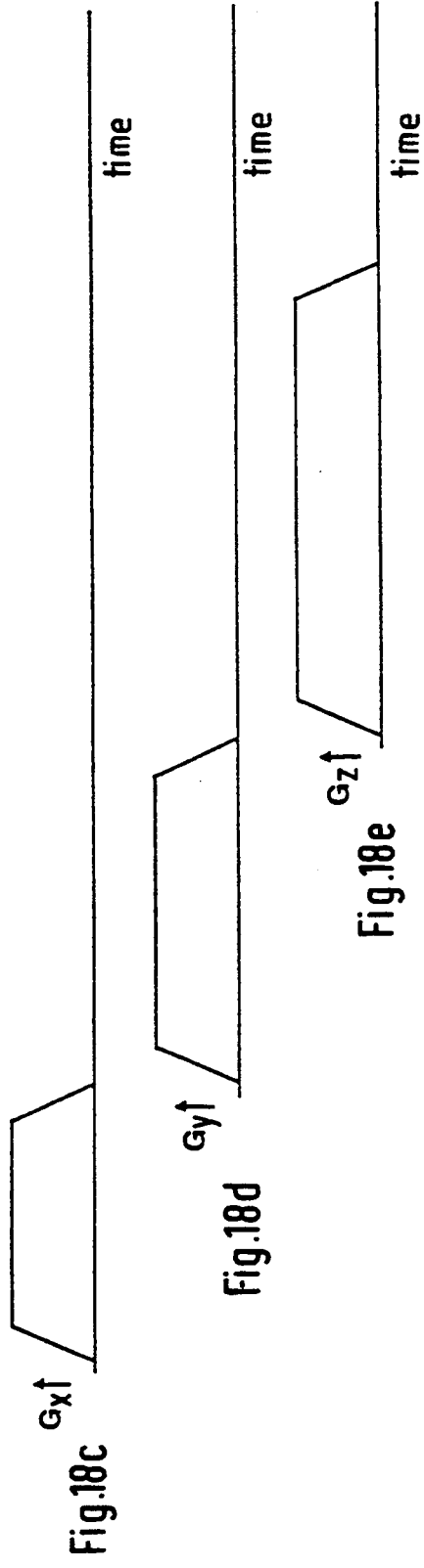

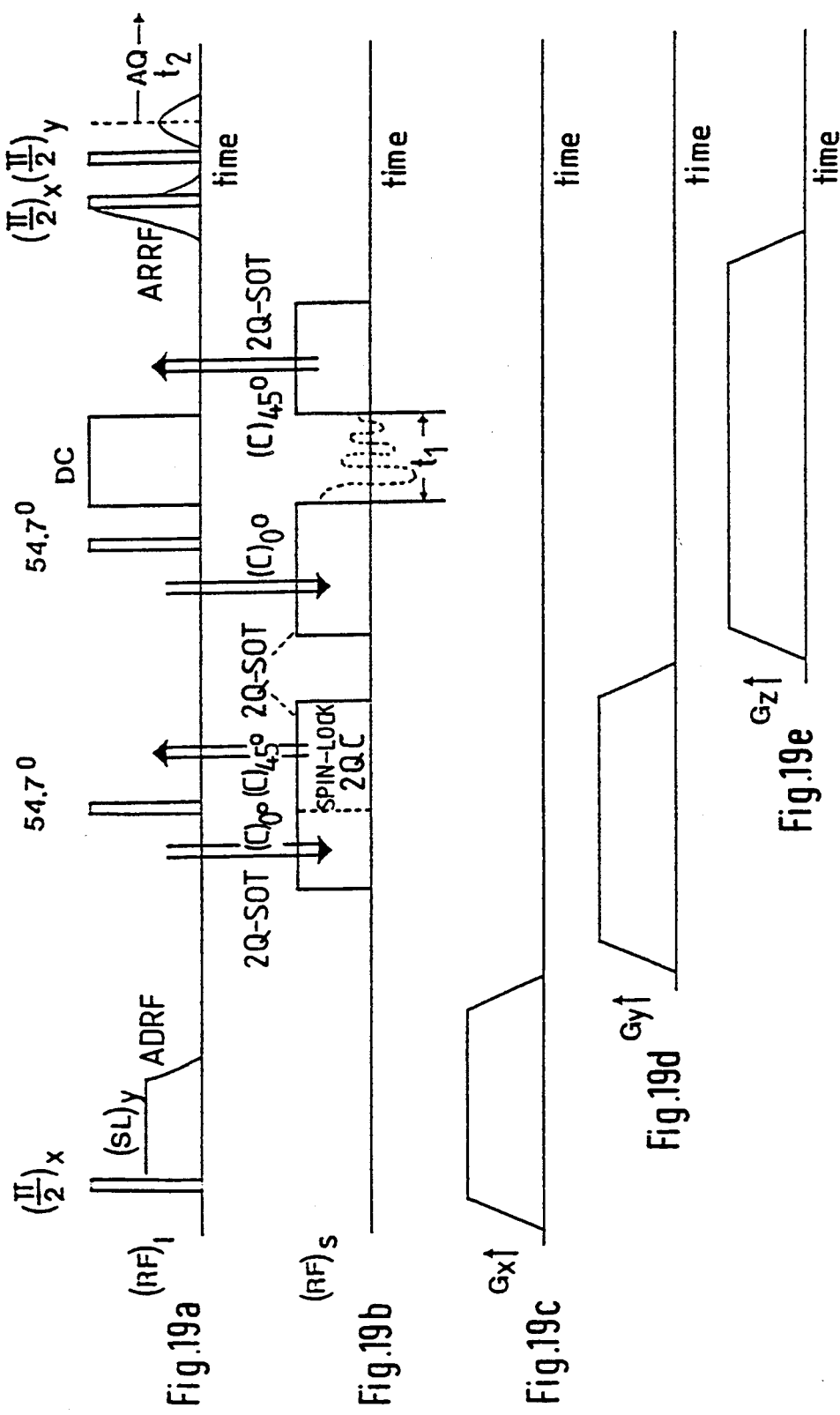

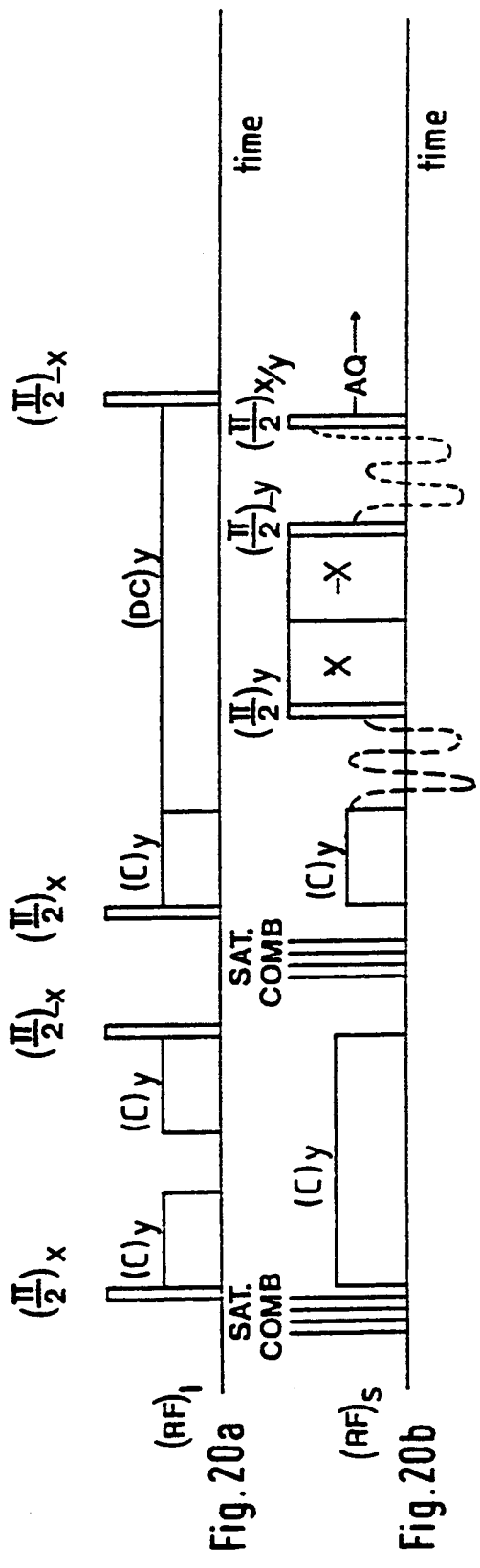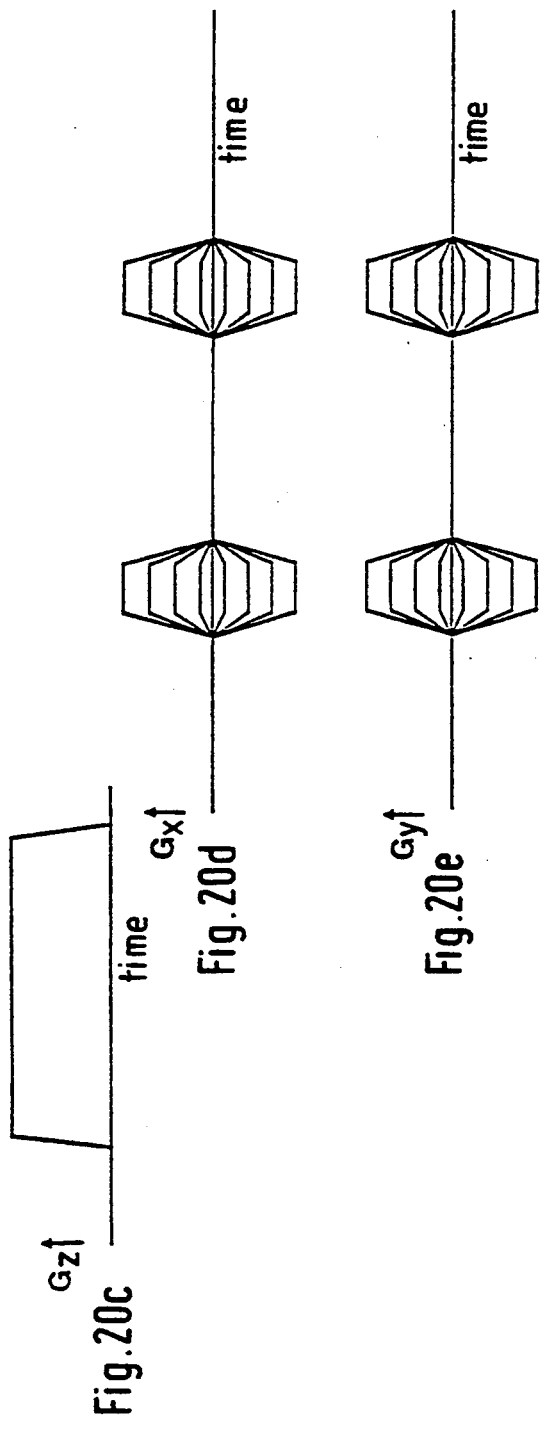
Fig. 20a
Fig. 20b
Fig. 20c
Fig. 20d
Fig. 20e

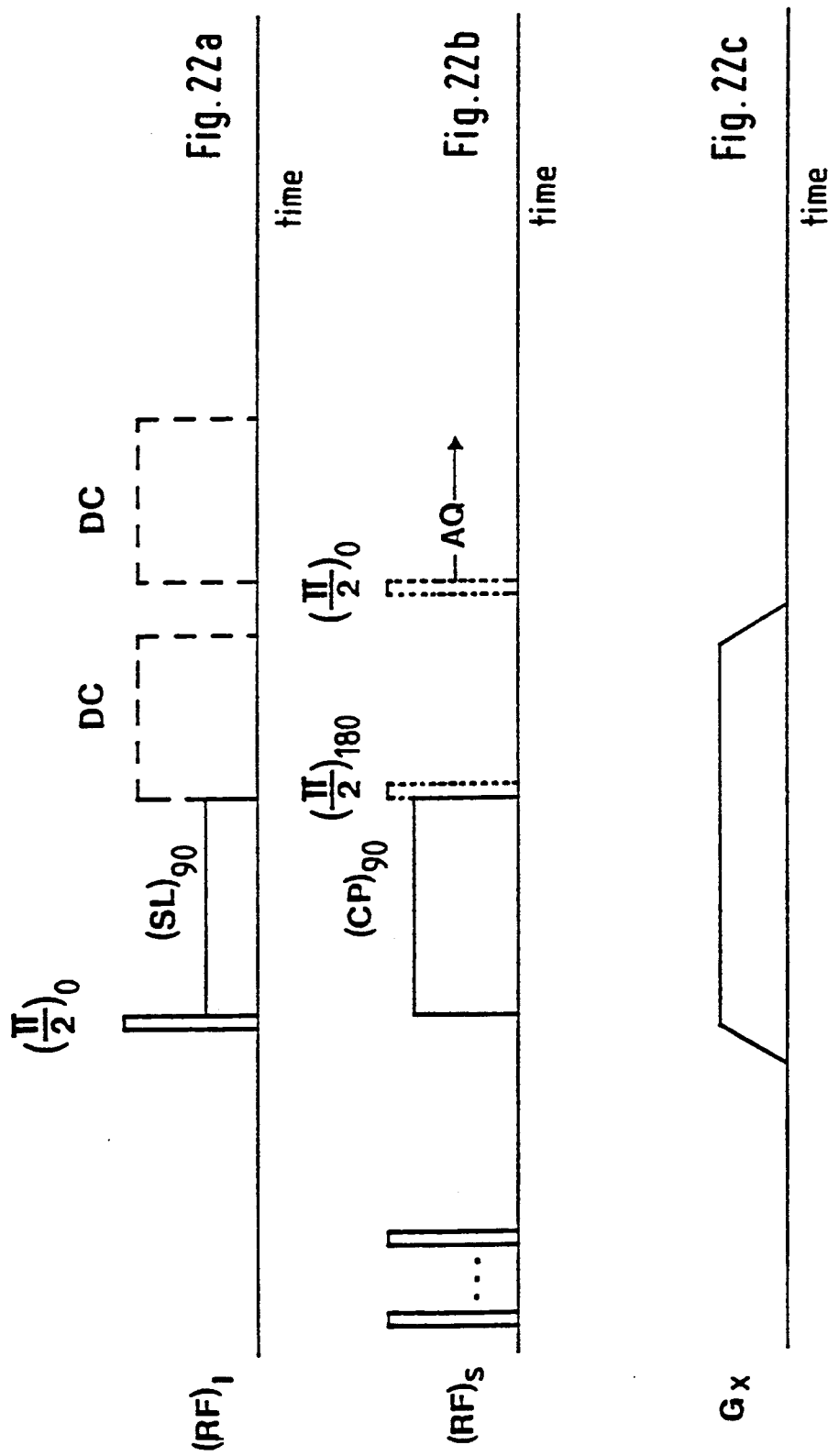

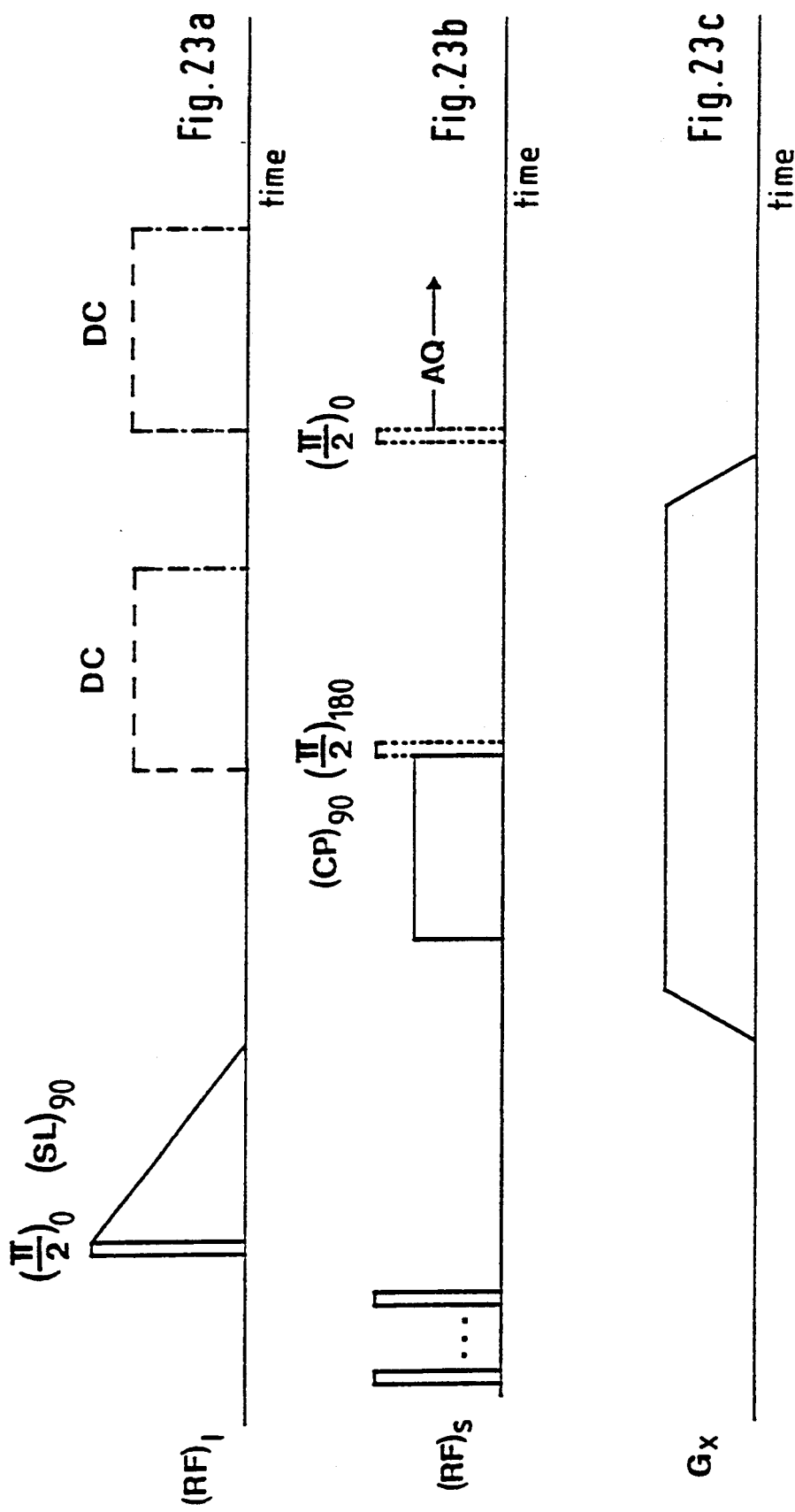

Fig. 25d
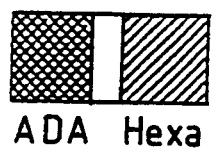
ADA  Hexa
Fig. 25a
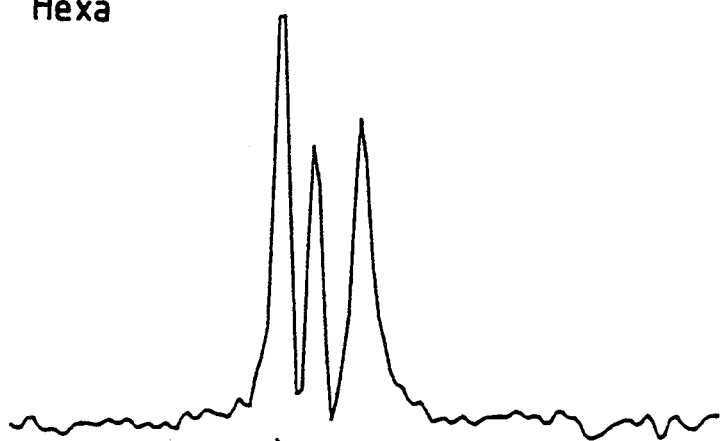
Fig. 25b
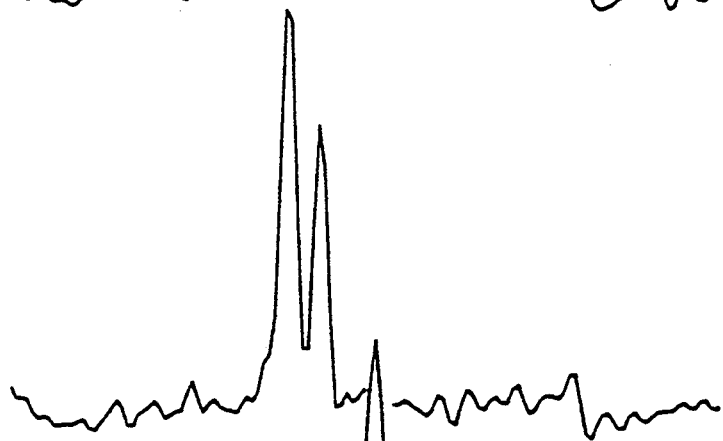
Fig. 25c
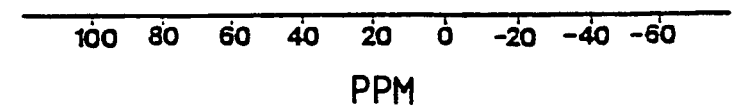
PPM

SLICE-SELECTIVE POLARIZATION TRANSFER FOR LOCALIZED SOLID-STATE NMR SPECTROSCOPY

BACKGROUND OF THE INVENTION

The present invention relates to a method for volume-selective nuclear magnetic resonance (NMR)-spectroscopy or NMR-imaging, wherein a radio frequency (RF)-pulse is irradiated onto a sample located inside a measuring volume in a homogeneous static magnetic field $B_o$ within a time interval during which an additional magnetic field gradient is applied to the measuring volume.

Such a method has been known for example from the LOSY-method published by E. Rommel and R. Kimmich in J. Magn. Reson. 83, 1989, p. 299 ff [0].

In the following, reference is made to publications cited in the reference list at the end of the specification using reference numerals in square brackets.

In the last few years several attempts have been undertaken to develop operational NMR imaging procedures for solid objects. This implies line-narrowing methods, i.e. magic-angle spinning [1] or multipulse sequences [2], and solid-echo phase-encoding methods [3–5]. It has also been suggested that one should transfer the polarization from abundant protons to rare nuclei such as $^{13}C$ in order to avoid the strong homonuclear line broadening of protons [6,7].

The latter approach in principle gives access to the spectral information of $^{13}C$ NMR parameters e.g. the chemical shift anisotropy. This is a crucial requirement for potential applications in material science. One is interested in not only a good reproduction of the morphology of the object, but rather would also like to measure physical and chemical parameters characterising the local material properties [3,6]. An example is the local polymer chain orientation in plastic materials which affects spectral properties due to anisotropic spin interactions [3].

Obtaining images which directly render the spatial distribution of such spectral parameters may be an excessively time-consuming process. Image-guided localized spectroscopy therefore is expected to be a more favourable procedure for this purpose. Local solid state spectra using the localized spectroscopy (LOSY) technique [8,9] have been already studied.

In extension to this homonuclear method, heteronuclear techniques based on a new spatial selection mechanism taking place with solid-state polarization transfer methods in the presence of magnetic field gradients are described. (The term "cross-polarization" is also widespread in this context. The more general term "spin-order transfer" would be more appropriate but has not yet come into use.) The spin species predominantly referred to are heteronuclear spins ½, e.g. a transfer from protons to $^{13}C$ nuclei. In principle spin order transfer to spins with higher quantum numbers is also feasible provided that dipolar coupling mediates the polarization transfer process.

SUMMARY OF THE INVENTION

Now, it is the object of the present invention to provide a method for volume-selective NMR-spectroscopy or NMR-imaging of the initially mentioned kind which is highly slice-selective and in which the spatial resolution exceeds that of the localization effect by spin-locking in the presence of field-gradients.

The invention achieves this object by means of a method in that the RF-pulse is an RF-contact pulse effecting a spin order transfer (SOT) from a first nuclear species to a second nuclear species of the matter contained in the sample.

The invention describes a new principle for spatially localizing solid-state NMR. The SOT process used in the invention is strongly susceptible to deviations from the resonance conditions. Various applications of the inventional method to NMR-imaging and localized heteronuclear spectroscopy are possible. Hence, the method according to the invention gives rise to a new class of methods to be used in connection with NMR tomography and NMR spectroscopy for improved sensitivity, spatial resolution and/or data-editing. It should be emphasised that especially for in-vivo-applications the evolution intervals and the echo refocussing intervals of the pulse sequences can be avoided in many cases so that the NMR-methods become unsensitive to movements of the mentioned object.

In a variant of the inventional method, the spatial resolution can be reached with the magnetic field gradient being a gradient of the static magnetic field $B_O$.

In a further variant, the magnetic field gradient is a gradient of the RF-field irradiated to the measuring volume by means of the RF-pulse. In this case the use of surface coils is advantageous.

In a preferred method, a spin-lock pulse is irradiated onto the sample within a time interval during which a magnetic field gradient is applied. Thus, the advantages of the LOSY-method are achieved at the same time.

Further, it may be of advantage, to perform several spin order transfers with RF-mismatch compensation; and/or to perform one or more refocussing spin order transfers; and/or to perform one or more spin order transfers according to the ADRF-method and to the ARRF-method; and/or to perform one or more spin order transfers according to the ADLF-method and the ARLF-method; and/or to perform one or more spin order transfer-contact processes by using synchronous WALTZ-16-sequences; and/or to perform one or more spin order transfer-contact processes by using FLOPSY-8-sequences; and/or to use only one frequency channel with or without modulation for the creation of resonant side bands in homonuclear applications; and/or to use gradients of the RF-field as well as of the static magnetic field $B_0$ at the same time for volume selection; and/or to detect the attenuation of the initial spin order (inverse SOT-detection); and/or to use multiple echos in order to improve resolution and sensitivity; and/or to use double quantum-SOT.

BRIEF DESCRIPTION OF THE DRAWINGS

The invention is further described and explained in more detail by reference to the embodiments illustrated in the drawing. The features which can be derived from the specification and the drawing may be applied to other embodiments of the invention either individually and in and of themselves or collectively in arbitrary combination.

In the drawing:

FIG. 1 shows schematically an RF- and field gradientpulse sequence for heteronuclear editing of I-signals of $I_nS_m$-spin systems by cyclic J crosspolarization (CYCLSOT-editing);

FIG. 2 shows a scheme like in FIG. 1, but with adiabatic cross-polarization (AJCP);

FIG. 3 shows a pulse scheme for the localized editing of I-signals of $I_nS_m$-spin systems by heteronuclar cyclic JCP (heteronuclear CYCLSOT-LOSY-editing);

FIG. 4 shows a pulse scheme like in FIG. 3, but with adiabatic cross-polarization pulses;

FIG. 5 shows a pulse scheme for the editing imaging of I-signals of $I_nS_m$-spin systems by heteronuclear cyclic JCP;

FIG. 6 shows an RF-pulse scheme for localized cross-polarization of S-spins by means of gradients of one of the RF-fields (heteronuclear LOSOT with one RF-gradient);

FIG. 7 shows an RF-pulse scheme like in FIG. 6, but with gradients of two RF-fields;

FIG. 8 shows an RF- and field gradient-pulse scheme for slice selecting excitation of S-spins in solids according to the ADRF-method;

FIG. 12A shows (a) a pulse scheme analogous to that of FIG. 10, but with inverse detection of the slice-selective SOT and FIG. 12B shows the experimental results;

FIG. 13 shows an RF- and field gradient-pulse scheme for $^{13}C$ imaging method with slice-selection by Hartmann-Hahn-cross polarization on the proton side and signal detection on the $^{13}C$-side;

FIG. 14 shows a schematic pulse sequence of double quantum-SOT-LOSY with spin-lock pulses;

FIG. 15 shows a pulse scheme of double quantum-SOT LOSY with ADRF/ARRF pulses;

FIG. 16 shows two variants (A) and (B) of double-quantum-SOT-methods for the detection of S-signals;

FIG. 17 shows two variants (A) and (B) of double-quantum-SOT-methods for the indirect detection of S-spins via I-signals;

FIG. 18 shows a pulse scheme for the SOT-LOSY-variant with an SOT-cycle for the indirect detection of S-spins via I-signals;

FIG. 19 shows a pulse scheme for the SOT-LOSY-variant with two SOT-cycles for the indirect detection of S-spins via I-signals;

FIG. 20 shows a pulse scheme for an SOT-imaging-variant for the direct detection of S-spins;

FIG. 22 shows an RF- and field gradient-pulse-scheme for SLOPT-LOSY;

FIG. 23 shows an RF- and field gradient-pulse-scheme for DOPT-LOSY;

FIG. 25 shows $^1H$ decoupled $^{13}C$ spectra of a sandwich test object (drawn schematically in the upper left corner) consisting of adamantane (ADA) and hexamethylbenzene (Hexa) separated by a tetrafluoroethlyene
a) without slice-selection
b) slice-selective within the adamantane part of the sample using the SLOPT-LOSY-method;
c) slice-selective with the slice centred at the hexamethylbenzene part of the sample;

DETAILED DESCRIPTION

Figure 9:
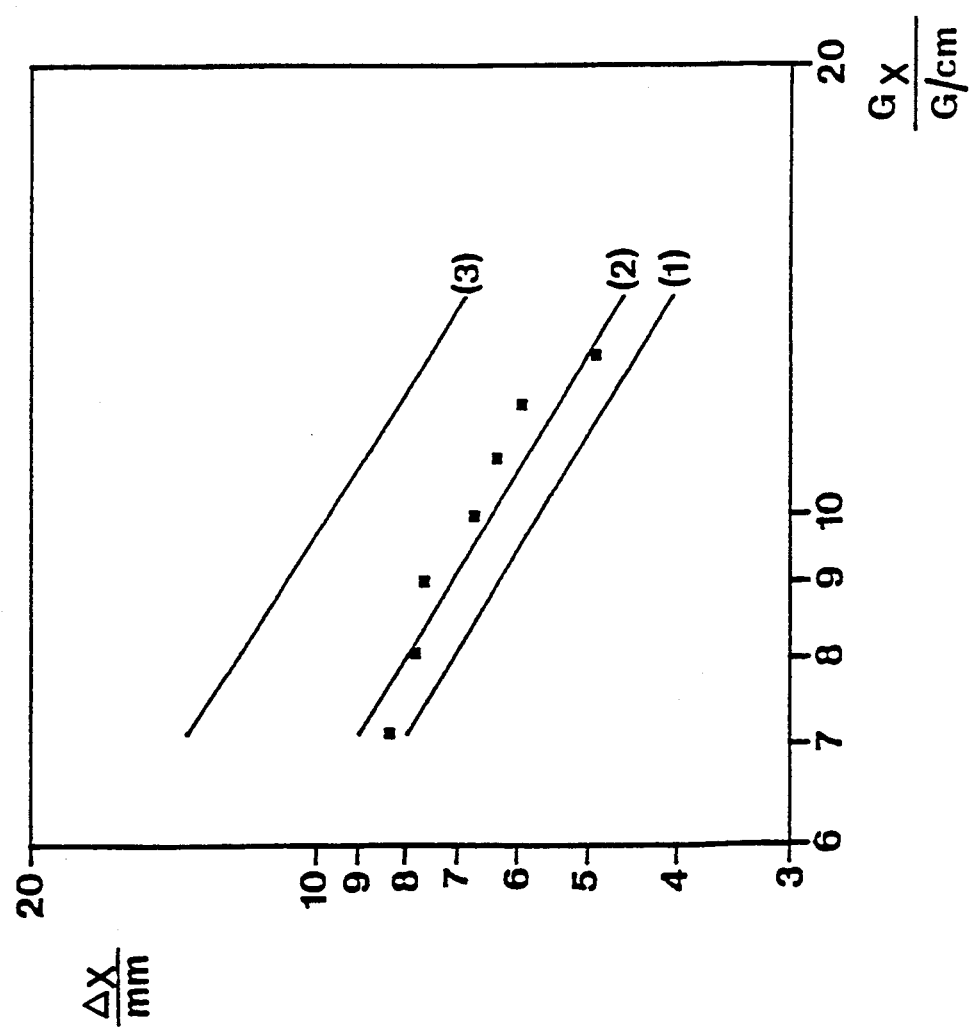
FIG. 9 shows experimental results of an application of the pulse sequence according to FIG. 8.

For the better understanding of the following details of the invention, some definitions and explanations of important facts and physical phenomena are given first:

Spins S and I can be homo- or hetero-nuclear spins which differ from one another in the resonant frequency and are coupled to each other i.e. they form a spin system. In a spin system there can exist one or more spins I or S. In solids, there are usually many spins, in fluids only a few, namely those which are located in a molecule or a group of molecules.

Spin order: The population of spin states are such that a correlation differing from Boltzmann-distribution exists between spin orientations ("up") or ("down") relative to the quantizing field and the interaction energy. The quantizing field can be the static homogeneous, the effective or the local magnetic field. Zeemann-order in the laboratory frame is caused by interaction with the static magnetic field $B_o$ or in the rotating coordinate frame by interaction with the effective magnetic field $B_{eff}$; dipole order is caused by dipolar or direct interaction between the nuclear dipoles;

quadrupolar order (also called spin-alignment) is caused by quadrupolar interaction between the electric quadrupole tensors of the nuclei with the electric field gradients at the nuclear position;

scalar order (also called J-order, zz-order or longitudinal scalar order) is caused by scalar or indirect spin-spin-interaction.

Spin order transfer or SOT is a process which causes the spins I and S to get into contact (couple) such that a spin order of one kind of spin is transferred to a spin order of any other kind of spin. The spin orders may be of different nature. In special cases, spin order transfer (SOT) is called cross-polarization (CP) or polarization transfer (PT).

Contact is present, when the effective fields in the rotating frame or the local fields representing the interactions in the laboratory frame are, for both kinds of spins, such that the effective energy splittings are matched. In this case, an energy transfer without involving other degrees of freedom is possible and in compliance with the law of energy conservation.

In the laboratory frame the direction of quantization is given by the static homogeneous magnetic field $B_0$.

In the rotating frames the direction of quantization is given by the effective field $B_{eff}$. The effective field can for example be equal to $B_1$ (component of the radio frequency field rotating in a direction of precession) or equal to the local field $B_{loc}$ (generated by the spin interactions).

Hartmann-Hahn-method: The spin order transfer (or cross polarization) takes place between spin-locked I-spins and S-spins irradiated with a contact pulse in solids as well as in fluids [10]. The Hartmann-Hahn matching condition reads:

$$\gamma_I B_1^{sl} = \gamma_I B_1^{contact}$$

where $B_1^{sl}$ und $B_1^{contact}$ are the radio frequency amplitudes of the two matched pulses. $\gamma_I$ and $\gamma_S$ are the gyromagnetic ratios.

Coherent SOT appears in very small spin systems (e.g. fluids) and is totally or partially reversible. This means that more or less dissipationless spin order transfer cycles may be performed. The Hartmann-Hahn-method for cross-polarization is also called JCP in this case. J stands for the spin-spin-coupling constant.

Incoherent SOT appears in large spin systems (solids, big molecules in fluids) and is irreversible. Back transfer is connected with large losses.

MOIST- or RF-mismatch-compensated Hartmann-Hahn-method: Phase alternating spin-lock pulses make the SOT insensitive to greater deviations from the Hartmann-Hahn-condition [14].

Waltz-16: SOT-conditions insensitive to RF-mismatch are reached by synchronous WALTZ-16 sequences [19]. The sequences are irradiated in the two frequency channels in view of the continuous RF of the Hartmann-Hahn-method.

FLOPSY-8: is a broad band homonuclear SOT described in detail in reference [23].

Adiabatic SOT: is reached by slow variation of RF-amplitudes over the matching of the effective energy splittings such that the matching needs not to be adjusted critically [24].

Refocussing SOT: is a variant in which polarization losses due to unwanted coherent transfer are avoided [25].

ADRF/ARRF-SOT: ADRF means "adiabatic demagnetization in the rotating frame". ARRF means "adiabatic remagnetization in the rotating frame". In both methods the RF-amplitude is changed adiabatically; the magnetization follows the effective field. Both methods are used for generating dipolar, quadrupolar or scalar order or for back-transferring into detectable magnetizations [26].

ADLF/ARLF-SOT: ADLF means "adiabatic demagnetization in the laboratory frame". ARLF means "adiabatic remagnetization in the laboratory frame". With these methods the static magnetic field $B_0$ or the emitter frequency $\omega$ is changed adiabatically to the same end as in ADRF and ARRF [27].

Jeener-Broekaert-Pulse sequence: Evolution methods for the generation of spin order states for interactions with the Hamiltonian operator depending bilinearly on the spin operators. Examples are quadrupole, dipole or scalar order. The first two orders can be realised in solids only, the last one especially also in fluids [28], [29]. The quadrupole order is also called spin alignment.

General difference to the class of population inversion methods: Examples are INEPT [30], DEPT [31] and CYCLPOTVOSING [32]. Here, a selective population inversion is reached by adequate evolution periods or selective RF-pulses. In contrast, methods for spin order transfer do not need any evolution intervals or selective pulses. Therefore, robust pulse sequences can be used which are insensitive to movements.

CPMAS means cross-polarization with rotation of the sample by the matching angle. CP stands for "cross-polarization" as suggested in the reference [33] for the sensitive detection of rare nuclei by multiple cross-polarization of the surrounding nuclei. Later, this line narrowing method was combined with a rotation by the matching angle resulting in a CPMAS-method [34].

Multiple echos: In order to improve resolution on the S-spin side or to improve the signal-noise ratio, a variety of echos can be generated after a "SOT" by means of a Carr-Purcell-Gill-Meiboom-pulse sequence. A crosspolarization pulse sequence of this kind has been suggested in reference [35].

Magic-angle pulse is an RF-pulse with a flip-angle of about 54,7°. The pulse effects the destruction of a dipolar or quadrupolar order [36].

Double quantum coherence in solids can be generated by a 90°-pulse irradiated in the presence of dipolar or quadrupolar order. Back transfer (signal giving) single coherence is reached by a 45° -pulse [37].

Double quantum SOT: In SOT-experiments the spin-order on the I-side can be transferred to double quantum spin order on the S-spin side by adequate matching [22].

Slice selection effect with SOT: Spin order transfer can be performed slice-selectively if at the same time a slice-gradient of the static magnetic field is applied. As explained in the initially cited reference [0], this may be reached by fulfilling the spin-lock condition only in one slice. Another reason for a further improvement of the resolution is that the matching requirement is met only in one slice and therefore the transfer can take place only in that slice.

Polarization transfer between heteronuclear spins I and S can be performed as originally proposed by Hartmann and Hahn by spin-locking the coherences of one spin species and applying simultaneously a contact pulse to the other with a radio frequency (RF) amplitude matched according to the Hartmann-Hahn condition [10, 11]. This spin-lock polarization transfer will be referred to by the acronym SLOPT.

Spin order of the abundant spins I can be produced by adiabatic demagnetization in the rotating frame (ADRF), by adiabatic demagnetization in the laboratory frame (ADLF) or by the aid of the Jeener-Broekaert pulse sequence [11, 12]. Polarization transfer is then achieved by a contact pulse irradiated on the rare spins S. This pulse must be "matched" to the local fields of the abundant spins. In the context of dipolar order we will use the acronym DOPT for dipolar order polarization transfer.

The advantages of those techniques are the enhancement of the rare-spin signals and the possibility to accumulate signals with an increased rate. The latter is possible because each excitation of the abundant spins permits multiple transfer processes to the rare spins until the reservoir of the abundant spins is fully exploited.

The pulse schemes of the slice-selective polarization transfer techniques to be discussed in the following are displayed in FIG. 22 (SLOPT-LOSY) and FIG. 23 (DOPT-LOSY). A magnetic field gradient is assumed in the x direction of the laboratory frame. A detailed treatment based on ref. [13] has been carried out. The result is that the polarization transfer rate $1/T_{IS}$ strongly depends on the x coordinate.

For spin-lock polarization transfer we find $$T_{IS}^{-1}(x) = \tfrac{1}{2}\sqrt{\pi}\,\sin^2\theta_I(x)\sin^2\theta_S(x) \times M_{2,SI}(x)\,\tau_c\,\exp[-\tfrac{1}{4}\Delta\omega_{eff}^2(x)\tau_c^2]. \quad (1)$$

In the case of dipolar-order polarization transfer the slice-selective transfer rate is $$T_{IS}^{-1}(X) = \tfrac{1}{2}\pi\sin^2\theta_S(X) \times M_{2,SI}(X)\tau_c\exp[-\omega_{eff,S}(X)\tau_c], \quad (2)$$

where $$\omega_{eff,I} = [\omega_{II}^2 + (\gamma_I G_x x)^2]^{\tfrac{1}{2}}, \quad (3)$$

$$\omega_{eff,S} = [\omega_{IS}^2 + (\gamma_I S G_x x)^2]^{\tfrac{1}{2}}, \quad (4)$$

$$\Delta\omega_{eff} = \omega_{eff,S}(x) - \omega_{eff,I}(x), \quad (5)$$

$$\sin\theta_I = \frac{\omega_{II}}{\omega_{eff,I}}, \quad (6)$$

$$\sin\theta_S = \frac{\omega_{IS}}{\omega_{eff,S}}, \quad (7)$$

$\gamma_I$ and $\gamma_S$ are the gyromagnetic ratios of the I and S spins, respectively, $\omega_{1I}$ and $\omega_{1S}$ denote the corresponding RF amplitudes expressed in circular frequency units. $G_x$ is the magnetic field gradient.

The correlation time $\tau_c$ characterises the fluctuations of dipolar interactions of the I spin system. $M_{2,SI}(X)$ is the local van Vleck second moment of the magnetic resonance line determined by the cross coupling dipolar interaction [13].

Using the concept of localized spin temperature [9] one finds that the spatial profile of the transferred S spin magnetization for a homogeneous sample is given by $$P(x)' = \frac{M_S(x' \cdot t)}{M_S(0, t)} = L(x')\frac{1 - e^{-nr(x)'}}{1 - e^{-n}}, \quad (8)$$

with $$L(x)' = \frac{\omega_{II}^2}{\omega_{eff,I}(x)'} \quad \text{for SLOPT-LOSY,}$$

$$= 1 \quad \text{for DOPT-LOSY,}$$

where $$n = \frac{t}{T_{IS}(0)}, \quad (9)$$

$$r(x)' = \frac{T_{IS}^{-1}(x)}{T_{IS}^{-1}(0)}, \quad (10)$$

and t is the length of the contact RF pulse. Note that the profile for the SLOPT-LOSY method implies the homonuclear LOSY effect due to spin-locking of the I spins in the presence of a field gradient.

From these formulae it becomes obvious that the S spins are excited slice selectively via polarization transfer. Parameters affecting the slice width are the magnetic field gradient, the contact time, $\omega_{1S}$ (DOPT-LOSY) and the mismatch parameter $\Delta\omega_{eff}$ (SLOPT-LOSY).

Figure 24A:
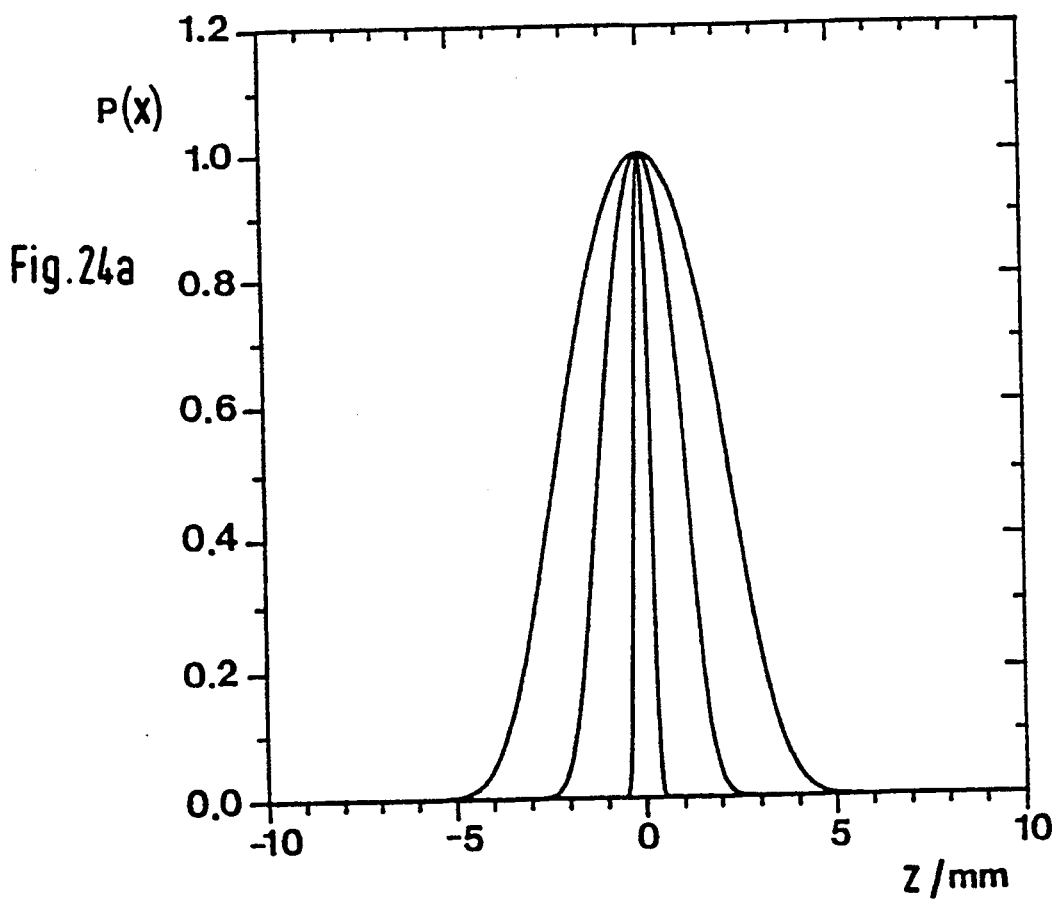
FIG. 24 shows calculated slice profiles for
a) SLOPT-LOSY and for
b) DOPT-LOSY.
Figure 24B:
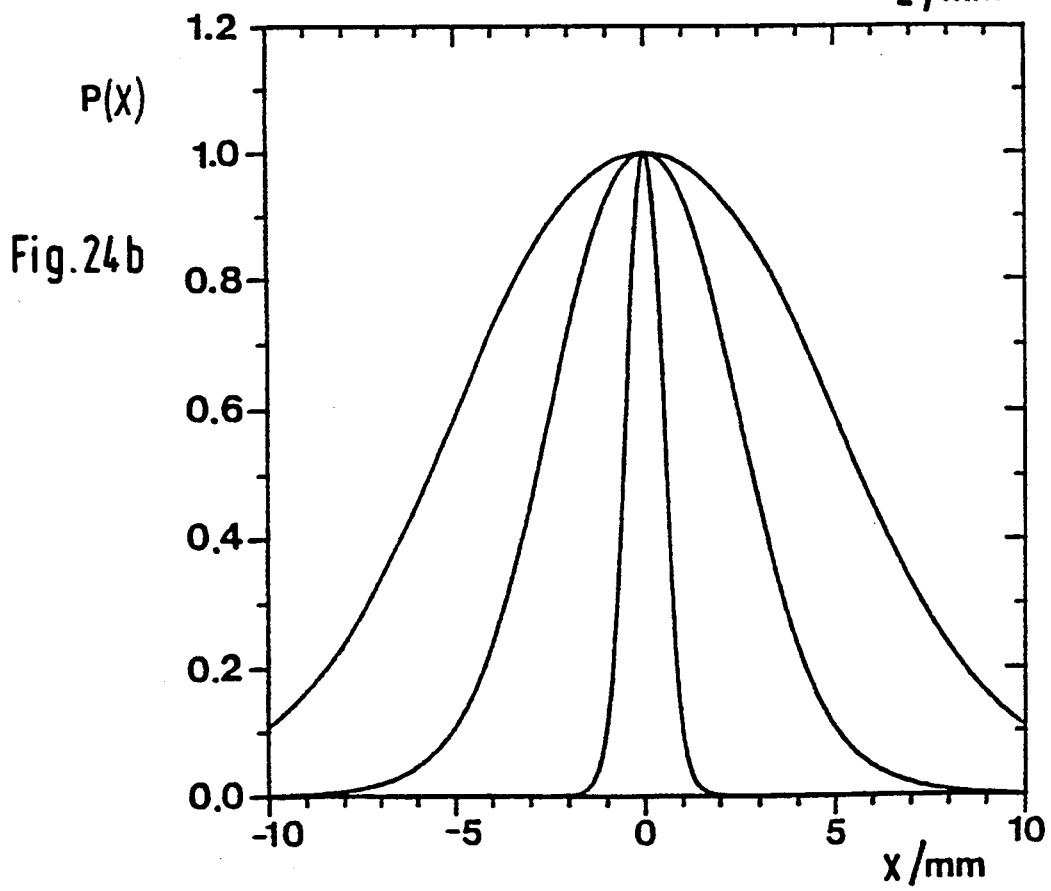

FIGS. 24, a, b show slice profiles for $^{13}C$ nuclei excited by polarization transfer from protons. The curves were calculated by the aid of the above formulas for different field gradients in the range 5–50 G/cm. The substance-specific parameters were taken for adamantane as a typical example. The correlation time in powdery adamantane was reported to be in a range $\tau_c = 122$ to 140 $\mu$s [15, 16]. The transfer time constant for DOPT assuming $\omega_{1S}/2\pi = 4.4$ kHz is $T_{IS}(0) = 6$ ms according to ref. [15]. For SLOPT a value $T_{IS}(0) \approx 0.9$ ms was estimated from our own experimental data and confirmed by theoretical considerations (compare ref. [13].)

The SLOPT-LOSY and DOPT-LOSY profiles are different because of the different x dependencies of $T_{IS}^{-1}$ and $L(x)$. The shapes are in both cases better approaches to an ideally rectangular shape than the Lorentzian profiles obtained with homonuclear LOSY [9].

The pulse sequences shown in FIGS. 22 and 23 were implemented on a Bruker Biospec BMT 40/47 tomograph operating at a proton frequency of 200 MHz. The double resonance probehead was home-made. The 90° pulse length was 6 $\mu$s for protons and 26 $\mu$s for $^{13}C$.

In a first set of experiments the storage and reading RF pulses indicated in FIGS. 22 and 23 were omitted so that the $^{13}C$ signals were recorded immediately after the contact pulses. No decoupling was employed and the field gradients were left during the whole scan time. The Fourier transform of the acquired free-induction signals therefore directly reflects the slice profiles of the excited $^{13}C$ coherences.

The slices were selected in the middle of an adamantane sample with a length of 1.7 cm. The repetition time of the experiments was 2 s, the RF amplitude of the contact pulse was $\omega_{1S}/2\pi = 4.4$ kHz (DOPT) and 8.33 kHz (SLOPT). The contact times were 10 and 1 ms, respectively.

Figure 11:
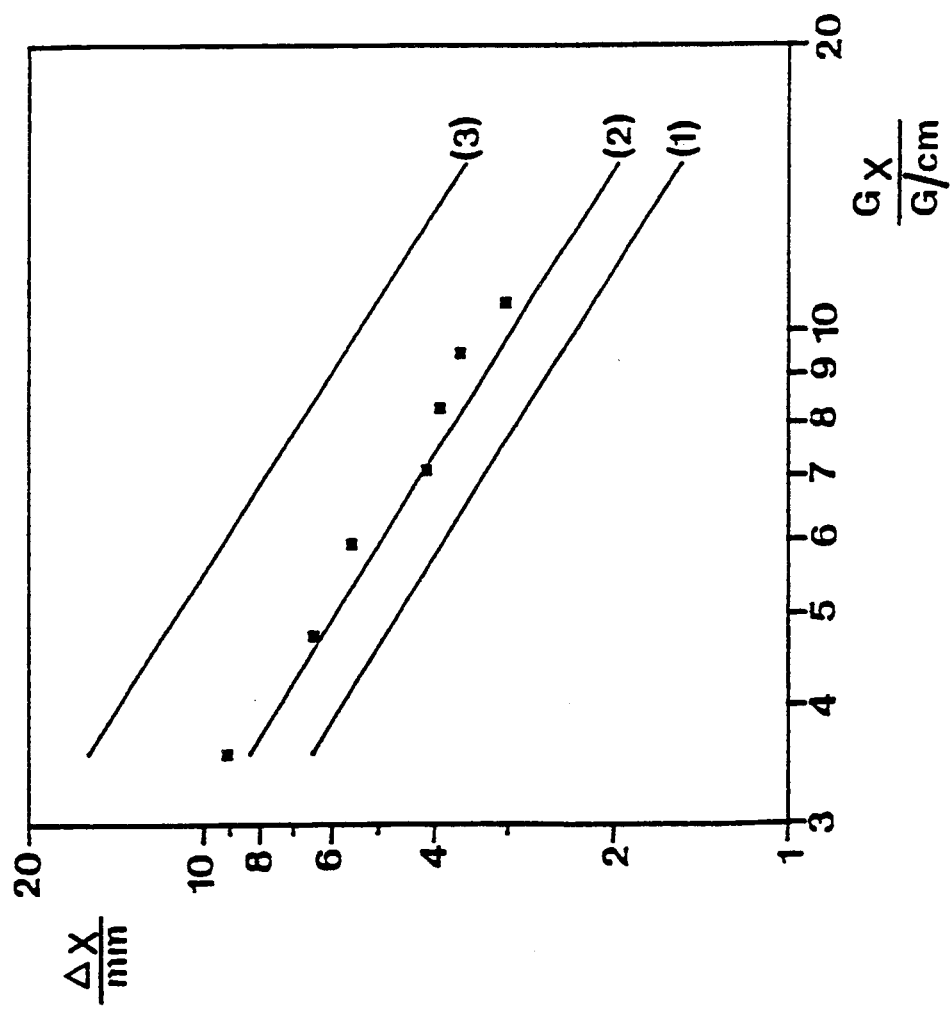
FIG. 11 shows experimental results of the application of the pulse sequence according to FIG. 10.

The plots in FIGS. 9 and 11 show the apparent slice widths measured at half height of the excitation profiles. Note that the measured profiles are somewhat broadened according to the non-negligible width of the $^{13}C$ line. The solid lines represent theoretical data derived from the above formula and after convoluting the profiles with the $^{13}C$ lineshape which was assumed to be Lorentzian [11]. The linewidth at half height was assumed to be 1.5 kHz.

For comparison the homonuclear LOSY slice widths are also plotted. It turns out that this effect which could determine the selected slice already on the proton side [9], prior to the polarization transfer so to speak, or on the $^{13}C$ side after the polarization transfer, but still in the presence of the contact pulse, is considerably less efficient than the slice-selective polarization transfer.

The full SLOPT-LOSY pulse sequence including storage and read-out pulses as displayed in FIG. 22 was also tested in order to demonstrate the suitability for localized $^{13}$C solid-state NMR. The test object in this experiment was an adamantane-tetrafluoroethylene-hexamethylbenzene sandwich sample as shown in the upper left part of FIG. 25.

The $^{13}$C spectrum (a) in FIG. 25 was recorded without slice-selection from the whole sample using broadband decoupling. The hexamethylbenzene peak (right) and the two adamantane peaks (left) are visible at the expected spectral positions [17]. Selecting a slice in the adamantane part or in the hexamethylbenzene part by the aid of the SLOPT-LOSY sequence produces spectra merely consisting of the two adamantane lines, spectrum (b), fig. 25, or of the hexamethylbenzene line, spectrum (c), fig. 25, respectively. Thus the assignment to the different spatial positions of the materials within the test object is clearly demonstrated.

The strong susceptibility of heteronuclear polarization transfer to off-resonance conditions offers a new localization principle for solid materials. In this way the sensitive and localized record of solid-state $^{13}$C spectra is possible. Two versions based on spin-locking or dipolar order of the abundant spins have been tested successfully. Both techniques simultaneously provide a considerable enhancement of the rare-spin signal by polarization transfer from the abundant spins.

With reference to the spatial resolution and shape of the excited profiles, it was found theoretically as well as experimentally that the SLOPT-LOSY technique is superior to the DOPT-LOSY method. The experiments of this study are preliminary and had to be carried out under relatively unfavourable conditions. In particular the available field gradients were rather moderate. Stronger gradients, as are common with so-called NMR microscopes, are expected to improve the spatial resolution far beyond the value demonstrated here (compare FIG. 24).

The sequences described above can be combined with other pulse methods as an element of solid-state NMR volume-selective spectroscopy or solid-state NMR imaging of dilute spins (e.g. refs. [6, 7]). The combination with magic-angle spinning may also be of interest using e.g. rotating gradients [7].

If necessary, an extension to really three-dimensional localization will be possible by the combination with conventional slice-selection methods such as the use of shaped pulses or homonuclear LOSY either with the abundant or with the dilute spins. A second slice-selective polarization transfer back to the abundant spins can also be visualized.

Compared with broadline $^1$H spectra the more structured $^{13}$C solid-state spectra are expected to provide correspondingly more information for the examination of local material properties in material sciences by NMR. Especially the chemical shift anisotropy is a promising property which may indicate the orientation of polymer chains, for instance.

On the other hand, the sensitivity of $^{13}$C spectroscopy is less than that of $^1$H studies even when enhanced by polarization transfer methods. It is, however, not so unfavourable as one might fear. An interesting comparison of solid-state $^{13}$C and $^1$H imaging in this respect has been reported in ref. [18].

The efficiency of the presented slice-selection procedures in principle does not depend on the rigidity of the material. Slice-selective (coherent) polarization transfer can even be observed in the case of J coupled spins in liquids as an alternative to the INEPT type methods previously published [20, 21].

Figure 26:
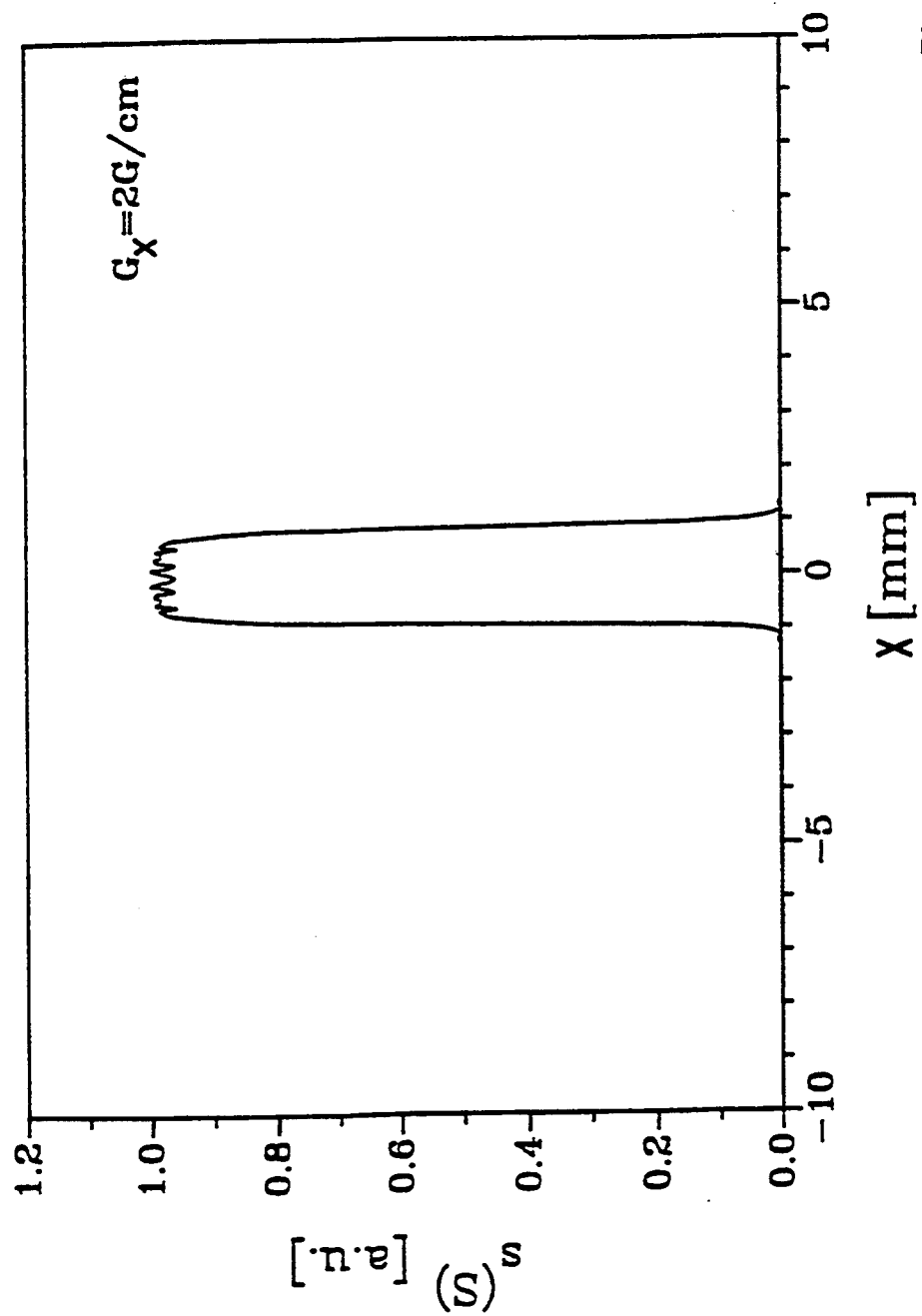
FIG. 26 shows a calculated slice profile for the case of adiabatic level crossing.

As an example for the application of the method discussed above to liquid samples, a slice profile calculated for the case of adiabatic level crossing is shown in FIG. 26.

Further variants may be single- or double-quantum transfers to quadrupole nuclei. In this case a kind of hole burning in the sense of the original Hartmann-Hahn experiment [10, 22] can be imagined where a slice-selective "hole" appears in the gradient broadened signal of the abundant spins as illustrated in FIG. 12b. This may be considered as a kind of indirect detection of the low-abundant spins with correspondingly high sensitivity.

Figure 27A:
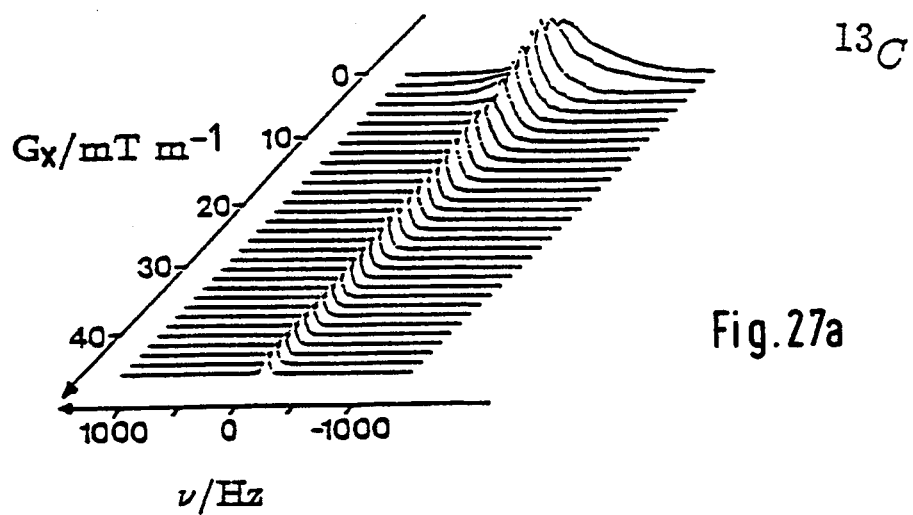
FIG. 27 shows experimental results demonstrating the slice-selectivity of J-cross-polarization in the presence of magnetic field gradients, namely
a) $^1H \rightarrow ^{13}C$ J-cross-polarization spectra of a single compartment methanol sample representing the slice profiles obtained with different slice-selection gradients,
b) slice-selective $^{13}C$ spectra recorded in a three-compartment sample (methanol solution/spacer/water)
c) comparative proton spectra slice-selectively recorded with the same sample as in b) using a conventional soft sinc pulse.

FIG. 27 shows the results of slice-selective J cross-polarization experiments. The profiles of the excited slices are represented by the methanol spectra in FIG. 27a recorded after forward polarization transfer $^1$H$\triangle^{13}$C.

Figure 27B:
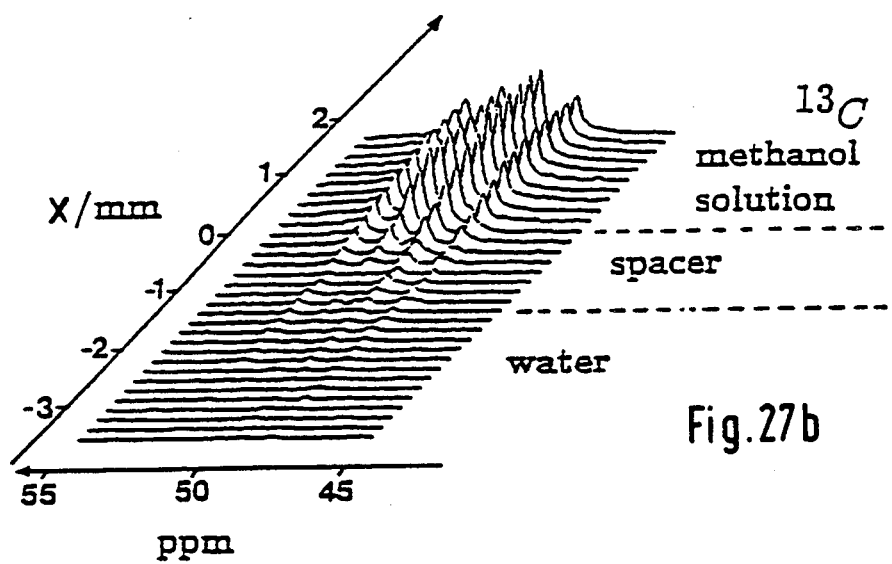
Figure 27C:
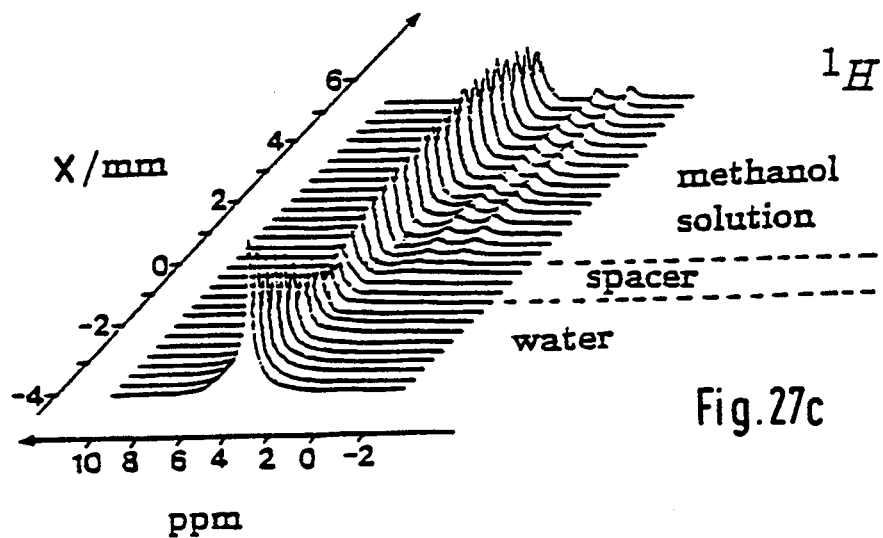
Figure 28:
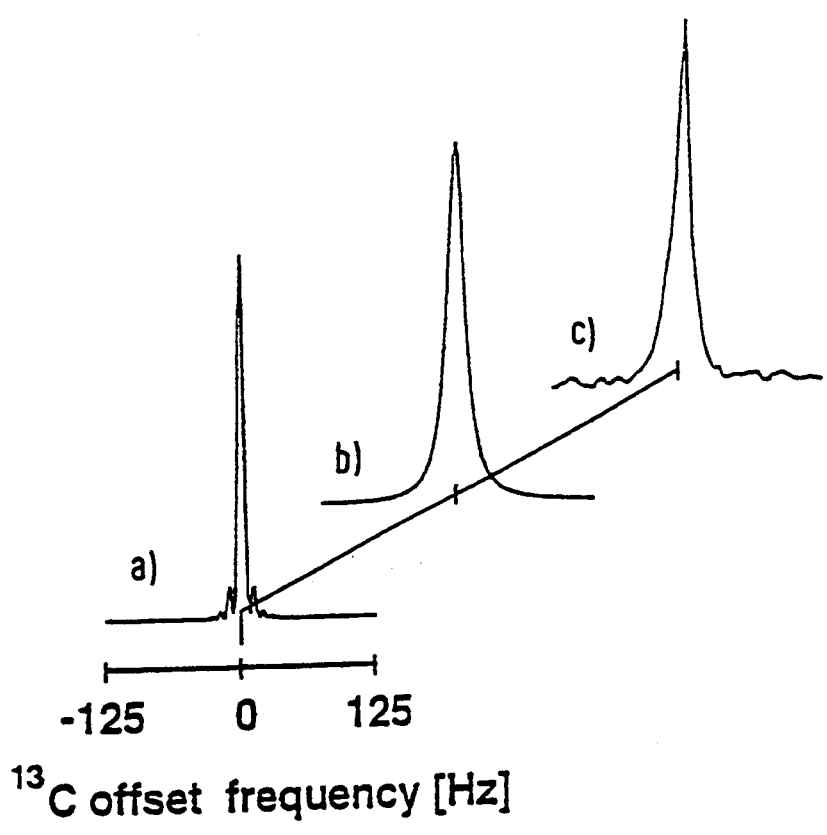
FIG. 28 shows JCP slice profiles
a) calculated without convolution,
b) calculated with an Lorentzian spectral line shape convolution,
c) experimental data of a decoupled $^{13}C$ profile of methanol.
Figure 29:
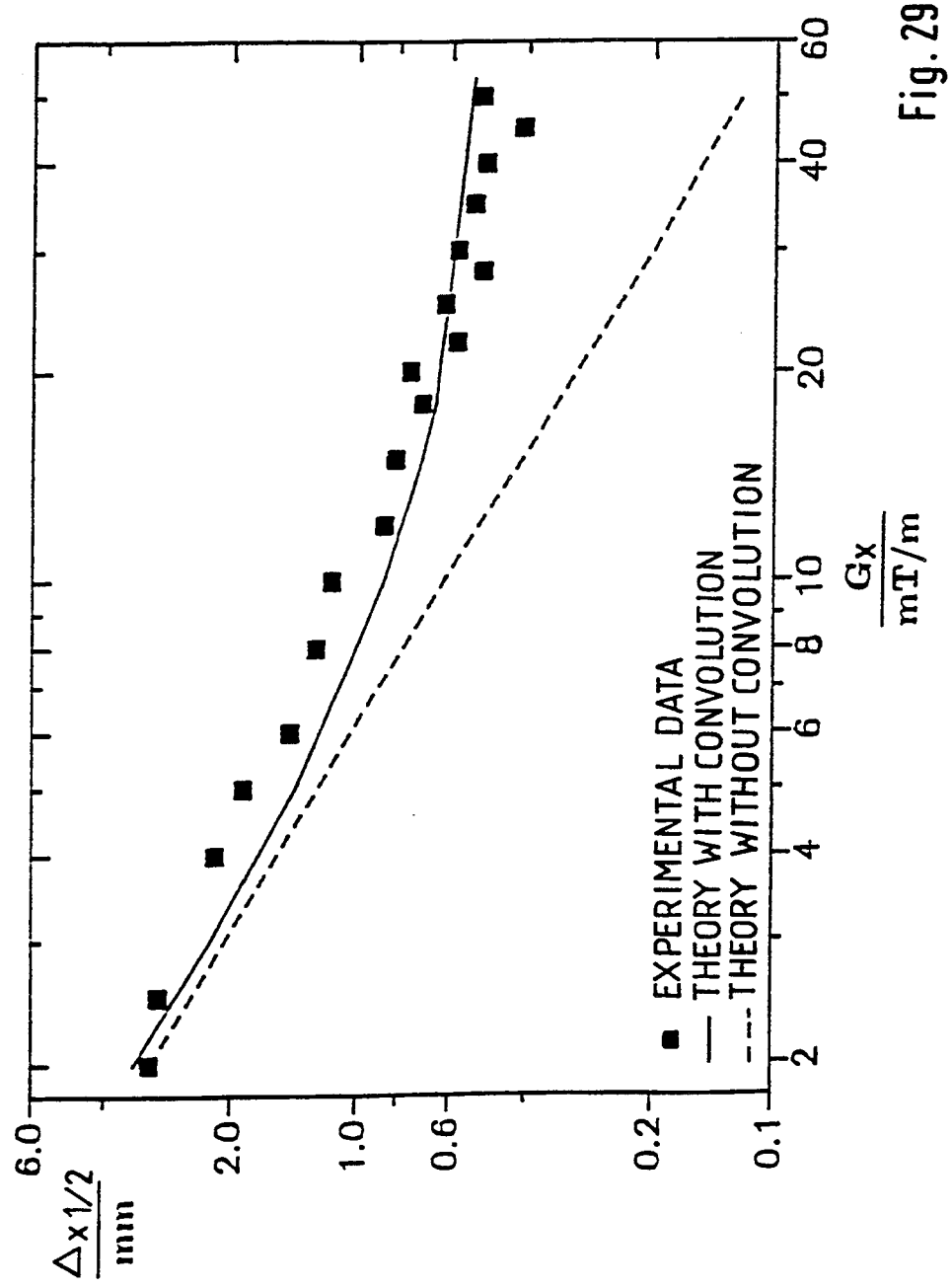
FIG. 29 shows experimental slice-width at half height versus slice gradient in comparison to theoretical expectation.

The $^{13}$C and $^1$H spectra in FIGS. 27b and 27c, respectively, were volume-selectively recorded from a three-compartment sample (water/spacer/methanol solution). J cross-polarization $^1$H$\rightarrow^{13}$C localized in the methanol compartment produces the quartet spectra of the $^{13}$C$^1$H$_3$ groups while no such signals are recorded when the sensitive slice is shifted in the water compartment. The slice selectivity is compared with that of a slice-selective sinc pulse applied in the proton channel (FIG. 27c). The theoretical slice profiles calculated on the basis of the above formalism in principle have to be convoluted with the spectral lineshape prior to any comparison with experiments. FIG. 28 shows the slice profiles calculated with and without convolution with a Lorentzian $$P_L = \frac{2\Delta\nu_{\frac{1}{2}}}{\pi[\Delta\nu_{\frac{1}{2}}^2 + 4(\nu_0 - \nu)^2]} \quad (11)$$

where the $\Delta_{\frac{1}{2}}$(chosen to be 15 Hz) is the width at half height and $\nu_o$ is the center frequency. The experimental slice profile (FIG. 28c) fits reasonably well to the convoluted theoretical profile (FIG. 28b). FIG. 29 finally shows the slice widths at half height of the profile as a function of the slice gradient. The experimental data are described by the theoretical profile widths after convolution with a Lorentzian spectral lineshape. If the convolution effect is negligible i.e. at low gradient values, a linear relationship between slice width and the inverse gradient can be stated:

$$\Delta_{x\frac{1}{2}} \propto G_x^{-1} \quad (12)$$

In the following, embodiments and variants of the present invention are discussed, guided by the figures of the drawing:

FIG. 1 illustrates a scheme of a pulse sequence for heteronuclear editing by cyclic J cross-polarization (CYCLCROP). The abbreviations are SL, spin-locking pulse, CP contact pulse, HS, homo-spoil pulse using a field-gradient G, DC, optional decoupling pulse, AQ, acquisition of the induction signals, sat., saturation pulses. The contact pulses are matched to the spin-locking pulses according to the Hartmann-Hahn condition. The cross-polarization intervals are optimized for maximum polarization transfer. This depends on the spin-spin coupling constant J, the size of the spin system, and on deviations from Hartmann-Hahn matching. After having transferred the polarization from the I to the S spins, the magnetization is stored in z-direction. The coherences of the abundant spins can be saturated by a comb of 90° pulses and are dephased by the homo-spoil pulse. The S spin magnetization is then spin-locked again and its polarization is transferred to the I spins. The corresponding coherences are detected optionally in the presence of an S spin decoupling pulse. The S spins are saturated by an initial comb of 90° RF pulses followed by a homo-spoil field-gradient pulse prior to the displayed pulse sequence.

The pulse scheme as illustrated in FIG. 2 is also used for heteronuclear editing by cyclic J cross-polarization. However, the spin-locking pulses SL and the cross-polarization pulses CP in FIG. 2 are adiabatic (AJCP).

With the pulse sequence shown in FIG. 3 localized editing of I-signals of $I_nS_m$ spin systems by heterocyclic JCP is possible. The forward and backward cross-polarizations are performed slice-selectively by application of appropriate gradients. For selection of the third spatial direction a LOSY-pulse is preset. The slice selection by cross-polarization is more selective than the LOSY-pulse, because, in addition to the spatially dependent spin-locking effect, the likewise spatially dependent matching effect is added. The gradient pulses may therefore be chosen smaller than according to the LOSY-method. The volume-selective and edited I-signal is read out as a Hahn-echo after a 180°-pulse. The editing effect is given by the choice of the resonance frequencies for the cross-polarization as discussed above. Other signals are defocussed by the uncompensated field gradients after switching off the locking pulses. Additional spoiling gradients may be applied optionally. The length of the cross-polarization pulses is again optimized according to J and the spin system under observation. Also, refocussing cross-polarization is possible. In contrast to CYCLPOT published before, there are no intervals with free evolution in the sequence except the Hahn-echo-detection, i.e. the method is insensitive to movements of the measured object. The relative phases of the saturation pulses and the spin-locking/contact pulses are arbitrary.

FIG. 4 shows again a pulse scheme for localized heteronuclear cyclic LOSY-editing, but with adiabatic cross-polarization and spin-locking pulses.

A pulse scheme similar to those of FIG. 3 and 4 is shown in FIG. 5, but with phase-encoding and reading field gradients for NMR-imaging. The cross-polarization pulses in this case are no longer slice-selective. They may be, however, adiabatic, as in the pulse schemes of FIG. 2 and 4.

Instead of applying a field gradient of the static magnetic field Be, spatial selectivity may be achieved by applying gradients of the RF-fields as shown in FIG. 6 (heteronuclear LOSOT with one RF-gradient). The spin-locking pulse applied to the I-channel has a spatially distributed amplitude (RF-gradient). This can be achieved, for example, by the use of surface coils which generate an RF-gradient in any case, but the same effect may be reached by special coil constructions like the anti-Helmholtz-arrangement. Following an optional selective saturation pulse not shown in the drawing, a contact pulse without RF-gradient is applied to the S-channel. Since the Hartmann-Hahn-condition is only satisfied in a small volume, the cross-polarization will be local only and hence localized and cross-polarization-amplified S-signals can be acquisited. This method is applicable to the coherent case (fluids) as well as to the incoherent case (solids). In the latter case, after I-spin excitation, multiple cross-polarization with successive signal-detection may follow analogous to the process according to the CPMAS-method. The spatial resolution of the above method is significantly better than the resolution one would expect from the excitation volume of a surface coil for example.

In the pulse scheme of FIG. 7, RF-gradients are applied to both frequency channels. The two gradients cannot be identical, i.e. they, in general, must be generated by different coils. Therefore, only a strictly determined volume for the RF-amplitude matching is possible. Under certain circumstances adiabatic pulses may also be used (dashed lines in the drawing), whereby the spatial resolution becomes necessarily worse.

A pulse sequence for slice-selective excitation of S-spins in solids is shown in FIG. 8. On the I-spin side (e.g. $^1$H-spins) dipolar order is generated according to the ADRF-method. On the S-spin side (e.g. $^{13}$C spins), following an initial comb of saturation pulses, a contact pulse is irradiated in the presence of a gradient of the static magnetic field $B_0$. By reading out the decoupled S-spin signals in the presence of the field gradient the Fourier-transform of the excitation profile is obtained. The profile information is convoluted with the line shape.

The experimental result of the application of the pulse sequence according to FIG. 8 is shown in FIG. 9.

Figure 10A:
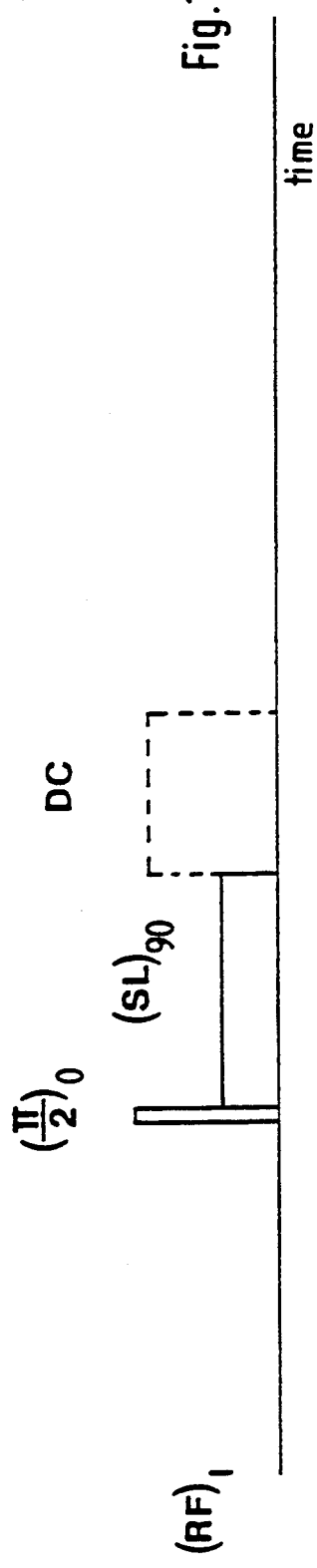
FIG. 10 shows a pulse scheme for slice selective excitation of S-spins in solids by means of a spin-lock pulse.
Figure 10B:
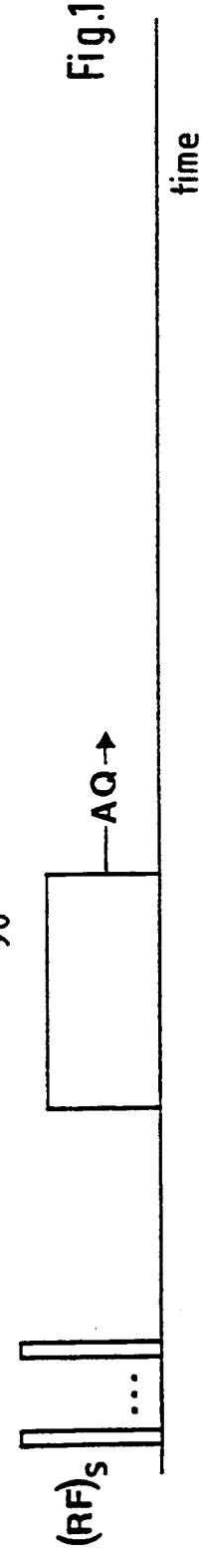
Figure 10C:
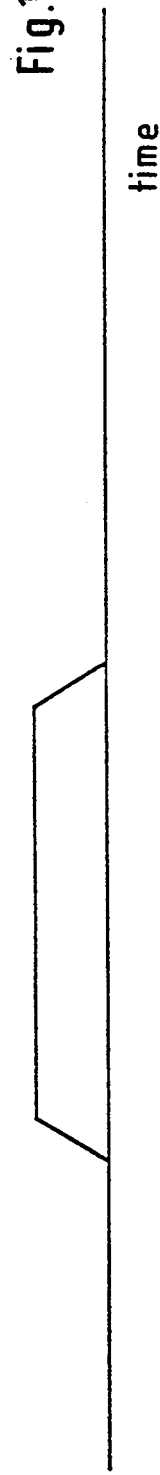

Application of the pulse scheme shown in FIG. 10 with the experimental results shown in FIG. 11 leads also to slice-selective excitation of S-spins in solids. On the I-spin side, Zeeman-order in the rotating frame is generated by application of a spin-lock pulse. Otherwise the pulse scheme of FIG. 10 works similarly to the pulse scheme of FIG. 8.

In FIGS. 9 and 11 a comparison of experimental slice widths measured at half height of the $^{13}$C profiles of adamantane to theory is given. The excitation of the profiles is based on the SLOPT-LOSY (FIG. 11) and the DOPT-LOSY (FIG. 9) methods for polarization transfer from $^1$H to $^{13}$C. The $^{13}$C signals were read out in the presence of the slice-selection gradient so that the Fourier transform directly provides the profile. The theoretical lines have been calculated without (1) and with (2) convolution with the $^{13}$C lineshape assumed to be Lorentzian with a width at half height of 1.5 kHz. The lines indicated by (3) represent the (much weaker) slice-selection by the homonuclear LOSY effect alone on the proton side (SLOPT) and on the $^{13}$C side (DOPT), respectively.

The method illustrated in FIG. 12 is analogous to that illustrated in FIG. 10, however, with inverse detection of the slice-selective SOT. Due to repeated contact pulses the Zeemann-order of the I-spins in the rotating frame is slice-selectively weakened. The I-spin signal is slice-selective analogous to the LOSY-method. By means of an additional slice-selective spin order transfer to the (fast relaxing) S-spins (e.g. quadrupolar nuclei) a "hole" is "burnt" into the LOSY-profile. An equalization by spin diffusion cannot take place in the relevant length and time scales.

FIG. 13 illustrates a pulse scheme for a $^{13}$C-imaging method with signal detection on the $^{13}$C-side. Slice selection is reached by Hartmann-Hahn cross-polarization from the proton side to the initially saturated $^{13}$C nuclei The pulse sequence of FIG. 14 shows double-quantum-SOT-LOSY with spin-lock pulses. Detection is performed indirectly on the proton side.

FIG. 15 shows a double-quantum-SOT-LOSY scheme with ADRF/ARRF-pulses. As a primary spin order bipolar order of protons is created e.g. with the ADRF-method. After slice-selective forward double-quantum-SOT the residing dipolar order is spoiled by means of a magic-angle pulse. By backward double-quantum-SOT the dipolar order is again built up slice-selectively and changed into z-magnetization using the ARRF-method. Detection is performed indirectly on the proton side.

The RF-pulse schemes of FIG. 16 illustrate two variants (A) and (B) of double-quantum-SOT methods for the detection of the S-signals. These methods can be used for example by application of surface coils.

The RF-pulse schemes of FIG. 17 show two variants (A) and (B) of double-quantum-SOT methods for the indirect detection of the S-spins via the I-signals. Again, surface coils may be used.

The pulse scheme of FIG. 18 illustrates an SOT-LOSY variant with an SOT-cycle for the indirect detection of S-spins via I-signal. On the S-spin side, double-quantum coherences are intermittently generated.

The variant according to FIG. 19 is very similar to that of FIG. 18 except that two SOT-cycles are used instead of one.

FIG. 20 shows a SOT-imaging variant for the direct detection of S-spins. On the I-spin side spin-lock pulses are applied. On the S-spin side a magic sandwich for the generation of an (invisible) double-quantum magic-echo is used.

Figures 21A, 21B, 21C, 21D, 21E:
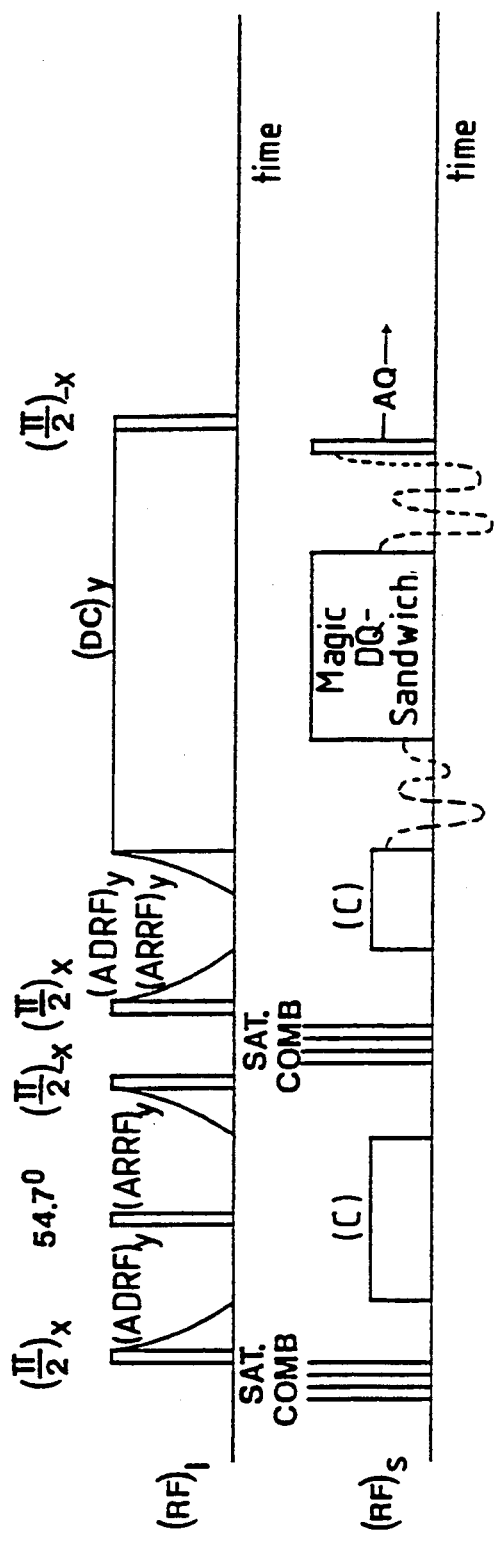
FIG. 21 shows a pulse scheme of an SOT-imaging variant for the direct detection of S-spins by means of ADRF/ARRF-cycles.

FIG. 21 shows a pulse sequence similar to FIG. 20, but with adiabatic excitation of the spin I system (ADRF and ADARRF pulses) and intermediate application of a magic angle pulse.

FIG. 22 shows an RF and field-gradient pulse scheme for SLOPT-LOSY methods. In the $RF_I$ channel the I spin coherences are first excited by a 90° pulse and then spin-locked (SL). Subsequently optional decoupling pulses (DC) can be irradiated. In the $RF_S$ channel the S spins are first saturated by a series of 90° pulses and then repolarized by (slice selective) polarization transfer from the I spin reservoir. The contact pulse (CP) is matched to the spin-lock pulse of the I spins according to the Hartmann-Hahn condition [10].

The S spin coherences appearing after switching the contact pulse off optionally can be stored by phase-shifted 90° pulse, so that the field gradient ($G_x$) can also be switched off. Thereafter the S spin coherences can be read out with another 90° pulse and the slice-selective signal can be acquired (AQ) in the absence of any field gradient.

FIG. 23 shows an RF and field gradient pulse scheme for DOPT-LOSY methods. In the $RF_I$ channel the I spin coherences are first excited by a 90° pulse and then spin-locked (SL) and transferred to the dipolar order state using the ADRF method. At a larger stage optional decoupling pulses (DC) can be irradiated. In the $RF_S$ channel the S spins are first saturated by a series of 90° pulses and then repolarized by (slice selective) polarization transfer from the I spin dipolar order reservoir. The contact pulse (CP) is matched to the local fields of the I spins.

The S spin coherences appearing after switching the contact pulse off optionally can be stored by phase-shifted 90° pulse, so that the field gradient ($G_x$) can also be switched off. Thereafter the S spin coherences can be read out with another 90° pulse and the slice-selective signal can be acquired (AQ) in the absence of any field gradient.

FIGS. 24a, b show slice profiles calculated for the SLOPT-LOSY (a) and DOPT-LOSY (b) techniques. The field gradient values are 5, 10 and 50 G/cm respectively, from the outer profile inwards.

In FIG. 25 $^1$H decoupled $^{13}$C spectra of a sandwich test object (drawn schematically in the upper left corner of the figure) are presented. The sample consists of adamantane (ADA) and hexamethylbenzene (HEXA) separated by a tetrafluoroethylene spacer. The total length of the sample was 16 mm, the diameter 7 mm. (a) Spectrum without slice selection. The left two lines refer to adamantane, the right-hand line to hexamethylbenzene. (b) Slice-selective $^{13}$C spectrum recorded by exciting a 2 mm thick slice within the adamantane part of the sample using the SLOPT-LOSY method including the storage/readout procedure. (c) Same as (b) but the slice centered at the hexamethylbenzene part of the sample.

As an example for the application of the above discussed principles to liquid samples, a calculated slice profile for the case of adiabatic level-crossing is shown in FIG. 26.

FIG. 27 shows experiments demonstrating the slice-selectivity of J cross-polarization in the presence of magnetic field gradients. The gradients were directed along the x axis coinciding with the RF coil axis. (a) $^1$H→$^{13}$C J cross-polarization spectra of a (single compartment) methanol sample representing the slice profiles obtained with different slice-selection gradients. The spectra were acquired under $^1$H decoupling and in the presence of a read gradient. The abscissae of the profiles are expressed in frequency units of the $^{13}$C Larmor frequency. The read gradient was 3 mT/m for all profiles so that 100 Hz correspond to 3.1 mm. (b) Slice-selective $^{13}$C spectra recorded in a three-compartment sample (methanol solution/spacer/water). The slice-selection gradient was 13.6 mT/m. The width at half height of the excited slice was 2 mm. The spectra were recorded without I spin decoupling and without any read gradient. The quartet of the methyl group is visible in the methanol compartment but disappears when the sensitive slice is shifted in the water compartment. The residual signals visible in the spacer region are due to the roots of the slice profiles. (c) Comparative proton spectra slice-selectively recorded with the same sample using a conventional soft sinc pulse (length 10 ms). The slice width was 1.7 mm. The water line as well as the methyl group doublet are visible.

FIG. 28 shows JCP slice profiles calculated without (a) and with convolution with a Lorentzian spectral lineshape assuming $\Delta\nu_{\frac{1}{2}}=15$ Hz. These curves are to be compared with the experimental decoupled $^{13}$C profile of methanol (c). The experimental profile was produced using a slice gradient of 28 mT/cm and a read gradient of 3 mT/cm corresponding to 321 Hz/cm.

FIG. 29 finally shows experimental slice width at half height versus slice gradient in comparison to theoretical expectations. If the broadening by the spectral linewidth is negligible, the slice width turns out to vary linearly with the inverse slice-selection field gradient.

References

[0] E. Rommel and R. Kimmich, J. Magn. Reson. 83 (1989) 299.

[1] W. S. Veeman and D. G. Cory, Advan. Magn. Reson. 13 (1989) 43, and references therein.

[2] D. G. Cory, J. B. Miller and A. N. Garroway, J. Magn. Reson. 90 (1990) 205.

[3] E. Rommel, S. Hafner and R. Kimmich, J. Magn. Reson. 86 (1990) 264.

[4] D. E. Demco, S. Hafner and R. Kimmich, J. Magn. Reson. 94 (1991).

[5] S. Hafner, D. E. Demco and R. Kimmich, Meas. Sci. Technol., in press, and references therein.

[6] N. M. Szeverenyi and G. E. Maciel, J. Magn. Reson. 60 (1984) 460.

[7] D. G. Cory and W. S. Veeman, J. Phys. E 22 (1989) 180.

[8] S. Hafner, E. Rommel and R. Kimmich, J. Magn. Reson. 88 (1990) 449. [9] D. E. Demco, R. Kimmich, S. Hafner and H. W. Weber, J. Magn. Reson. 94 (1991).

[10] S. R. Hartmann and E. L. Hahn, Phys. Rev. 128 (1962) 2042.

[11] M. Mehring, High resolution NMR spectroscopy in solids, 2nd Ed. (Springer, Berlin 1983).

[12] D. A. McArthur, E. L. Hahn and R. E. Walstedt, Phys. Rev. 188 (1969) 609.

[13] D. E. Demco, J. Tegenfeld and J. S. Waugh, Phys. Rev. B11 (1975) 4133.

[14] M. H. Levitt, J. Chem. Phys. 94 (1990) 30.

[15] A. Pines and T. W. Shattuck, J. Chem. Phys. 61 (1974) 1255.

[16] H. T. Stokes and D. C. Ailion, Phys. Rev. B 15 (1977) 1271.

[17] H. O. Kalinowski, S. Berger and S. Braun $^{13}$C spectroscopy (Thieme, Stuttgart, 1984).

[18] J. B. Miller and A. N. Garroway, J. Magn. Reson. 85 (1989) 255.

[19] A. J. Shaka, J. Keeler and R. Freeman, J. Magn. Reson. 53 (1983) 313.

[20] A. Knüttel, R. Kimmich and K. -H. Spohn, J. Magn. Reson. 86 (1990) 526.

[21] A. Knüttel, K.-H. Spohn and R. Kimmich, J. Magn. Reson. 86 (1990) 542.

[22] G. Schnur, R. Kimmich and F. Winter, J. Magn. Reson. 66 (1986) 295.

[23] A. Mohebbi and A. Shaka, Chem. Phys. Letters 178 (1991) 374.

[24] G. C. Chingas, A. N. Garroway, W. B. Moniz, R. D. Bertrand, J. Am. Chem. Soc. 102 (1980) 2526.

[25] G. C. Chingas, A. N. Garroway, R. D. Bertrand and W. B. Moniz, J. Magn. Reson. 35 (1979) 283.

[26] A. N. Garroway and G. C. Chingas, J. Magn. Reson. 38 (1980) 179.

[27] A. Abragam and W. G. Proctor, Phys. Rev. 109 (1958) 1441.

[28] J. Jeener and P. Broekaert Phys. Rev. 157 (1967) 232.

[29] R. Kimmich, E. Rommel and A. Knüttel, J. Magn. Reson. 81 (1989) 333.

[30] G. A. Morris and R. Freeman, J. Am. Chem. Soc. 101 (1979) 760.

[31] D. P. Burum and R. R. Ernst, J. Magn. Reson. 39 (1980) 163.

[32] A. Knüttel and R. Kimmich, J. Magn. Reson. 83 (1989) 335.

[33] A. Pines, M. G. Gibby and J. S. Waugh, J. Chem. Phys. 59 (1973) 569.

[34] E. O. Stejskal, J. Schaefer and J. S. Waugh, J. Magn. Reson. 28 (1977) 105.

[35] J. Tegenfeldt in Nuclear Magnetic Resonance in Solids, ed. L. Van Gerven, Plenum Press, New York (1977) 281.

[36] S. Emid, J. Magn. Reson. 42 (1981) 147.

[37] S. Emid, J. Smidt and A. Pines, Chem. Phys. Letters 73 (1980) 496.

We claim:

1. A method for volume-selective nuclear magnetic resonance (NMR) spectroscopy or NMR-imaging comprising the steps of,
   a) locating a sample within a homogeneous static magnetic field $B_0$, said sample containing a first and second nuclear species,
   b) applying a magnetic field gradient to the sample and,
   c) irradiating a contact-RF-Pulse into the sample within a time interval during which the magnetic field gradient is applied, whereby a spin order transfer (SOT) from the first to the second nuclear species located in a slice transverse to a gradient direction of the magnetic field gradient is effected.

2. The method according to claim 1, wherein the magnetic field gradient is a gradient of the static magnetic field $B_0$.

3. The method according to claim 2, comprising the additional step of irradiating a spin-lock pulse into the sample within the time interval during which the magnetic field gradient is applied.

4. The method according to claim 1, wherein the magnetic field gradient is a gradient of an RF-field irradiated into the sample by means of the RF-pulse.

5. The method according to claim 4, comprising the additional step of irradiating a spin-lock pulse into the sample within a time interval during which the magnetic field gradient is applied.

* * * * *